(12) United States Patent
Eto et al.

(10) Patent No.: US 12,424,817 B2
(45) Date of Patent: Sep. 23, 2025

(54) LIGHT-EMITTING DEVICE

(71) Applicant: NICHIA CORPORATION, Anan (JP)

(72) Inventors: Kazuya Eto, Anan (JP); Soichiro Miura, Tokushima (JP); Takuya Hashimoto, Tokushima (JP); Masatoshi Nakagaki, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 756 days.

(21) Appl. No.: 17/727,594

(22) Filed: Apr. 22, 2022

(65) Prior Publication Data

US 2022/0344896 A1    Oct. 27, 2022

(30) Foreign Application Priority Data

Apr. 23, 2021 (JP) ................................. 2021-073426
Dec. 17, 2021 (JP) ................................. 2021-205249
Mar. 17, 2022 (JP) ................................. 2022-042111

(51) Int. Cl.
*H01S 5/00* (2006.01)
*H01S 5/02216* (2021.01)
*H01S 5/02315* (2021.01)
*H01S 5/02345* (2021.01)
(Continued)

(52) U.S. Cl.
CPC ...... *H01S 5/02315* (2021.01); *H01S 5/02216* (2013.01); *H01S 5/02345* (2021.01);
(Continued)

(58) Field of Classification Search
CPC ............. H01S 5/02315; H01S 5/02216; H01S 5/02345; H01S 5/02469; H01S 5/0683;
(Continued)

(56) References Cited

U.S. PATENT DOCUMENTS

2004/0027631 A1    2/2004  Nagano et al.
2005/0069266 A1*   3/2005  Kouta ................. H01S 5/02365
                                                   372/36
(Continued)

FOREIGN PATENT DOCUMENTS

JP    2002-057411 A    2/2002
JP    2004-047651 A    2/2004
(Continued)

*Primary Examiner* — Kinam Park
(74) *Attorney, Agent, or Firm* — Global IP Counselors, LLP

(57) ABSTRACT

A light-emitting device includes first and second light-emitting elements, upper submounts, and a lower submount. The upper submounts include a first submount having a first upper surface and a first lateral surface located on a same side as an emission end surface of the first light-emitting element, and a second submount having a second upper surface and a second lateral surface located on a same side as an emission end surface of the second light-emitting element. In a top plan view, the first lateral surface is located forward relative to the second lateral surface, and the emission end surface of the first light-emitting element is located forward relative to the emission end surface of the second light-emitting element. At least a portion of the first lateral surface is protruded forward relative to an edge along which an upper surface and a lateral surface of the lower submount meet.

18 Claims, 14 Drawing Sheets

(51) Int. Cl.
*H01S 5/024* (2006.01)
*H01S 5/0683* (2006.01)
*H01S 5/40* (2006.01)
*H10F 55/155* (2025.01)
*H01S 5/02255* (2021.01)
*H01S 5/02326* (2021.01)
*H10F 77/40* (2025.01)

(52) U.S. Cl.
CPC ........ *H01S 5/02469* (2013.01); *H01S 5/0683* (2013.01); *H01S 5/4093* (2013.01); *H10F 55/155* (2025.01); *H01S 5/02255* (2021.01); *H01S 5/02326* (2021.01); *H10F 77/413* (2025.01)

(58) Field of Classification Search
CPC ............... H01S 5/4093; H01S 5/02255; H01S 5/02326; H10F 55/155
See application file for complete search history.

(56) References Cited

U.S. PATENT DOCUMENTS

| | | | |
|---|---|---|---|
| 2009/0134413 A1* | 5/2009 | Roth | C09K 11/661 |
| | | | 257/E31.095 |
| 2010/0127301 A1* | 5/2010 | Chen | F21K 9/00 |
| | | | 257/E33.075 |
| 2017/0063034 A1* | 3/2017 | Tanisaka | H01L 21/67075 |
| 2020/0185877 A1* | 6/2020 | Kawaguchi | H01S 5/02326 |
| 2021/0135426 A1* | 5/2021 | Miura | H01S 5/02255 |
| 2021/0384698 A1 | 12/2021 | Nishikawa et al. | |

FOREIGN PATENT DOCUMENTS

| | | |
|---|---|---|
| JP | 2006-332329 A | 12/2006 |
| JP | 2020-126989 A | 8/2020 |
| WO | 2018003156 A1 | 1/2018 |
| WO | 2020174982 A1 | 9/2020 |

\* cited by examiner

LIGHT-EMITTING DEVICE

CROSS-REFERENCE TO RELATED PATENT APPLICATION

The present application claims priority under 35 U. S. C. § 119 to Japanese Patent Applications No. 2021-073426, filed on Apr. 23, 2021, No. 2021-205249, filed on Dec. 17, 2021, and No. 2022-042111, filed on Mar. 17, 2022. The entire disclosures of Japanese Patent Application Nos. 2021-073426, 2021-205249, and 2022-042111 are hereby incorporated herein by reference.

BACKGROUND

Technical Field

The present disclosure relates to a light-emitting device.

Description of Related Art

Light-emitting devices having light-emitting elements and mirrors to reflect light emitted from the light-emitting elements in a lateral direction have been known. For example, JP 2020-126989 discloses a light-emitting device having a plurality of semiconductor laser elements, a plurality of submounts securing the plurality of semiconductor laser elements, a mirror to reflect light emitted from the plurality of semiconductor laser element in a lateral direction to upward, and a heat sink having the plurality of submounts and the heat sink disposed thereon.

SUMMARY

It is an object of the present disclosure to provide a light-emitting device with improved heat dissipation of the package.

In one non-limiting exemplary embodiment according to one aspect of the present invention, a light-emitting device includes a first light-emitting element, a second light-emitting element, a plurality of upper submounts and a lower submount. The first light-emitting element has a first emission end surface including one or more first light-emitting points each configured to emit a first light. The second light-emitting element has a second emission end surface including one or more second light-emitting points each configured to emit a second light. The plurality of upper submounts include a first submount and a second submount. The first submount includes a first upper surface on which the first light-emitting element is disposed, and a first lateral surface extending from the first upper surface and located on a same side as the first emission end surface of the first light-emitting element. The second submount includes a second upper surface on which the second light-emitting element is disposed, and a second lateral surface extending from the second upper surface and located on a same side as the second emission end surface of the second light-emitting element. The lower submount includes an upper surface on which the first submount and the second submount are disposed, and a front lateral surface extending from the upper surface and located on a same side as the first lateral surface of the first submount and the second lateral surface of the second submount. In a top plan view of the upper surface of the lower submount, with a propagating direction of the first light along an optical axis being forward, the first lateral surface of the first submount is located forward relative to the second lateral surface of the second submount, the first emission end surface of the first light-emitting element is located forward relative to the second emission end surface of the second light-emitting element, and at least a portion of the first lateral surface of the first submount is protruded forward relative to an edge along which the upper surface and the front lateral surface of the lower submount meet.

In one non-limiting exemplary embodiment according to one aspect of the present invention, a light-emitting device includes a first light-emitting element, a second light-emitting element, a first submount, a second submount, and a package. The first light-emitting element has a first emission end surface including one or more first light-emitting points each configured to emit a first light. The second light-emitting element has a second emission end surface including one or more second light-emitting points each configured to emit a second light. The first submount has a first upper surface, on which the first light-emitting element is disposed, and a first lateral surface extending from the first upper surface and located on a same side as the first emission end surface of the first light-emitting element. The second submount has a second upper surface on which the second light-emitting element is disposed, and a second lateral surface extending from the second upper surface and located on a same side as the second emission end surface of the second light-emitting element. The package includes a base portion having a mounting surface, lateral wall portions surrounding the mounting surface and extending upward, and a mounting block portion having an upper surface located higher than the mounting surface. The first submount and the second submount are disposed on the upper surface of the mounting block portion. The mounting block portion further has a front lateral surface located on a same side as the first lateral surface and the second lateral surface, and extending from the upper surface of the mounting block portion. In a top plan view of the upper surface of the mounting block portion, with a propagating direction of the first light along an optical axis being forward, the first lateral surface of the first submount is located forward relative to the second lateral surface of the second submount, the first emission end surface of the first light-emitting element is located forward relative to the second emission end surface of the second light-emitting element, and at least a portion of the first lateral surface of the first submount is protruded forward relative to an edge along which the upper surface and the front lateral surface meet.

According to certain embodiments of the present disclosure, a light-emitting device with good heat dissipating properties can be provided.

DETAILED DESCRIPTION OF EMBODIMENTS

Figure 1:
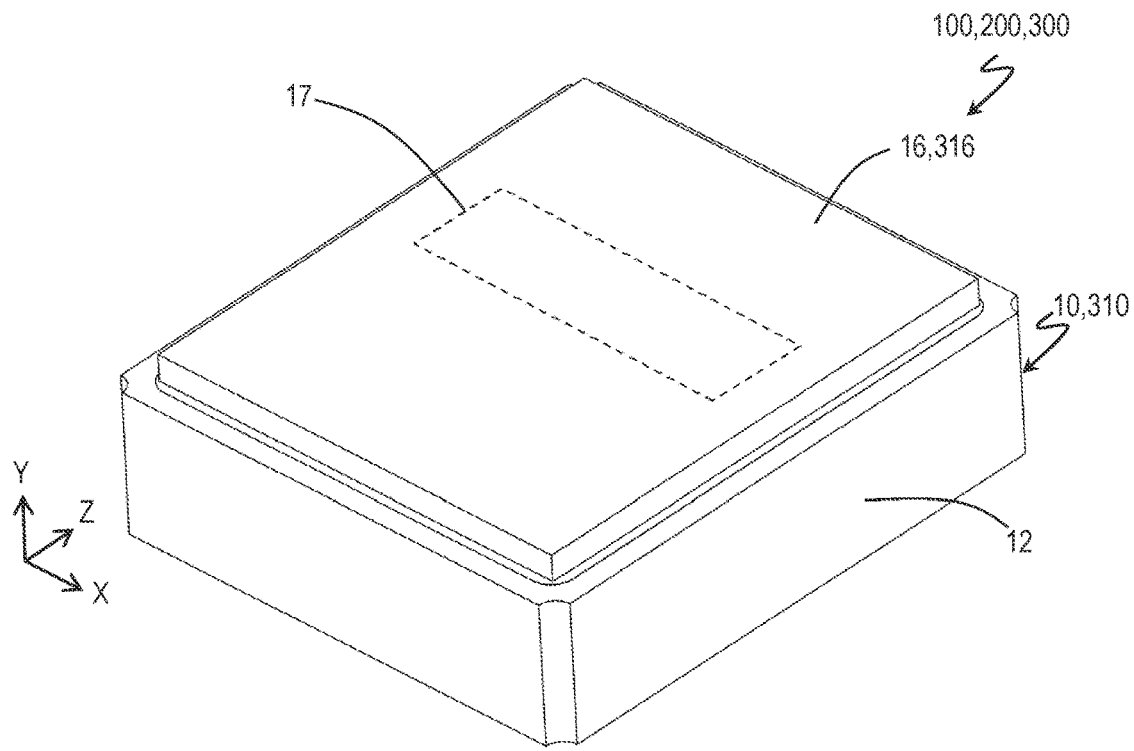
FIG. 1 is a schematic perspective view of a light-emitting device according to a first embodiment to a third embodiment of the present invention.

In the specification and claims herein, a polygonal shape, such as a triangle, quadrangle, or the like, is not limited to the polygonal shape in a strictly mathematical sense, and includes any of those shapes subjected to processing such as cutting angles, chamfering, beveling, rounding, or the like. Acceptable modifications are not limited to modifications to corners (ends of sides), and shapes with modifications at intermediate portions of sides are also referred to as polygons. That is, shapes that are based on polygonal shapes and partially modified are within the interpretation of the term "polygon" in the present specification and the claims.

The same applies not only to polygons, but also to terms that describe certain shapes, such as trapezoidal shapes, circular shapes, recesses and protrusions. The same applies to each side that forms its shape. That is, even if an end or an intermediate portion of a side is modified, the modified portion is interpreted as a portion of a "side." When "polygonal shapes" and "sides" without such modified portions are intended to be distinguished from those with modifications, the term "exact" is added, such as an "exact quadrangular shape."

In the specification or claims herein, when there are a plurality of components that are to be distinguished from each other, these components may be described using ordinals such as "first" and "second" may be added before the name of the components. For example, in the case of reciting "a light-emitting element is disposed on a substrate" in a claim, it might be described in the description as "a first light-emitting element and a second light-emitting element are disposed on a substrate." The counters, such as "first" and "second," are merely used to distinguish two light-emitting elements. There is no special meaning associated with the order of the counters. An element accompanied by the same ordinal might not refer to the same element between the specification and the claims. For example, in the case in which elements are specified by the words, "a first light-emitting element," "a second light-emitting element," and "a third light-emitting element," in the specification, "a first light-emitting element" and "a second light-emitting element" recited in the claims might correspond to "a first light-emitting element" and "a third light-emitting element" in the specification. Furthermore, in the case in which the term, "a first light-emitting element," is used, but the term, "a second light-emitting element," is not used in claim 1, the invention according to claim 1 is sufficient if it includes one light-emitting element, and the light-emitting element is not limited to "a first light-emitting element" as used in the specification, i.e., it can be "a second light-emitting element" or "a third light-emitting element" in the specification.

In the description or the scope of claims herein, terms indicating specific directions or positions (e.g., "upper," "lower," "right," "left" and other terms including these) might be used. These terms, however, are merely used for the purpose of making the relative directions or positions in the drawings being referenced more easily understood. As long as the relationship between the directions or the positions indicated with the terms such as "upper," "lower," or the like is the same as those in a referenced drawing, the layout of the elements in other drawings, or actual products and manufacturing equipment outside of the present disclosure, does not have to be the same as that shown in the referenced drawing.

The sizes, size ratios, shapes, spacing and the like of the constituent elements shown in the drawings might be exaggerated for clarity of explanation. Certain elements might be omitted in a drawing so as not to make the drawing excessively complex.

Certain embodiments of the present invention will be explained below with reference to the accompanying drawings. The embodiments described below give shape to the technical ideas of the present invention, but do not limit the present invention. The numerical values, shapes, materials, steps, and the sequence of the steps described in the embodiments described below are merely examples, and are modifiable in various ways to the extent that such a modification does not cause technical inconsistencies. In the explanation below, the same designations and reference numerals denote the same or similar elements, for which a redundant explanation will be omitted as appropriate.

First Embodiment

With referring to FIG. 1 to FIG. 12, a structure of a light-emitting device 100 according to a first embodiment will be described. FIG. 1 through FIG. 12 are diagrams for illustrating the light-emitting device 100 according to one embodiment of the present invention. X-axis, Y-axis, and Z-axis orthogonal to one another are indicated in certain drawings for reference.

Figure 2:
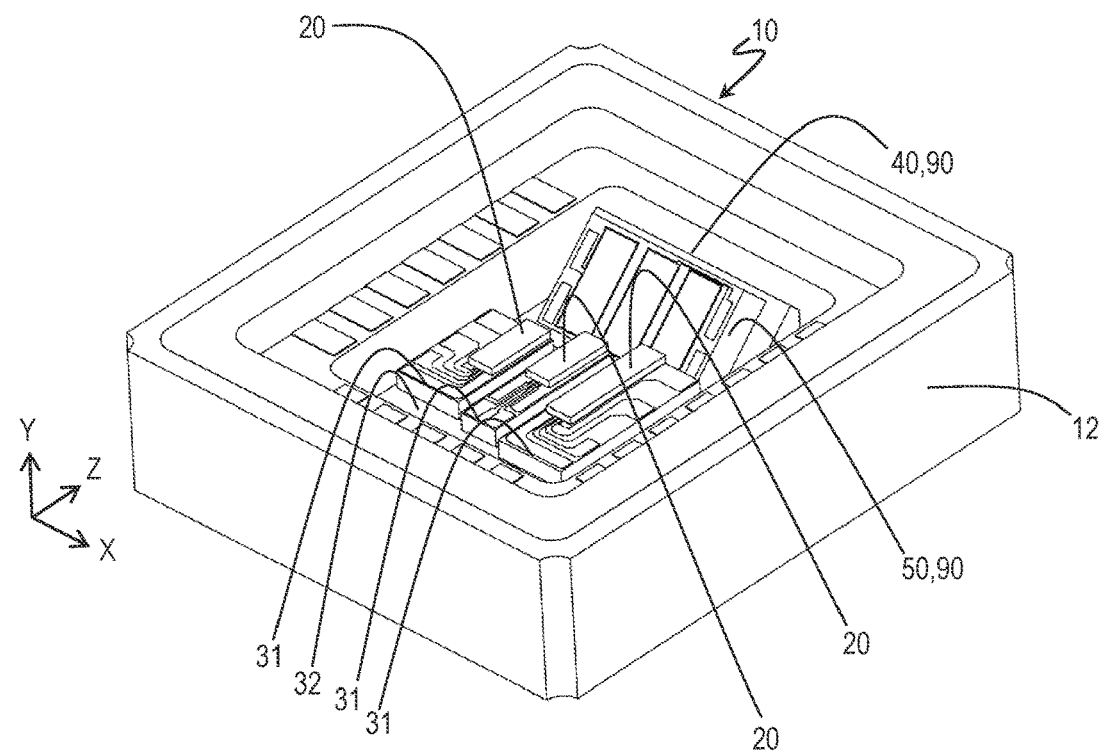
FIG. 2 is a schematic perspective view of a light-emitting device according to the first embodiment of the present invention, in which a lid of a package is not shown.
Figure 3:
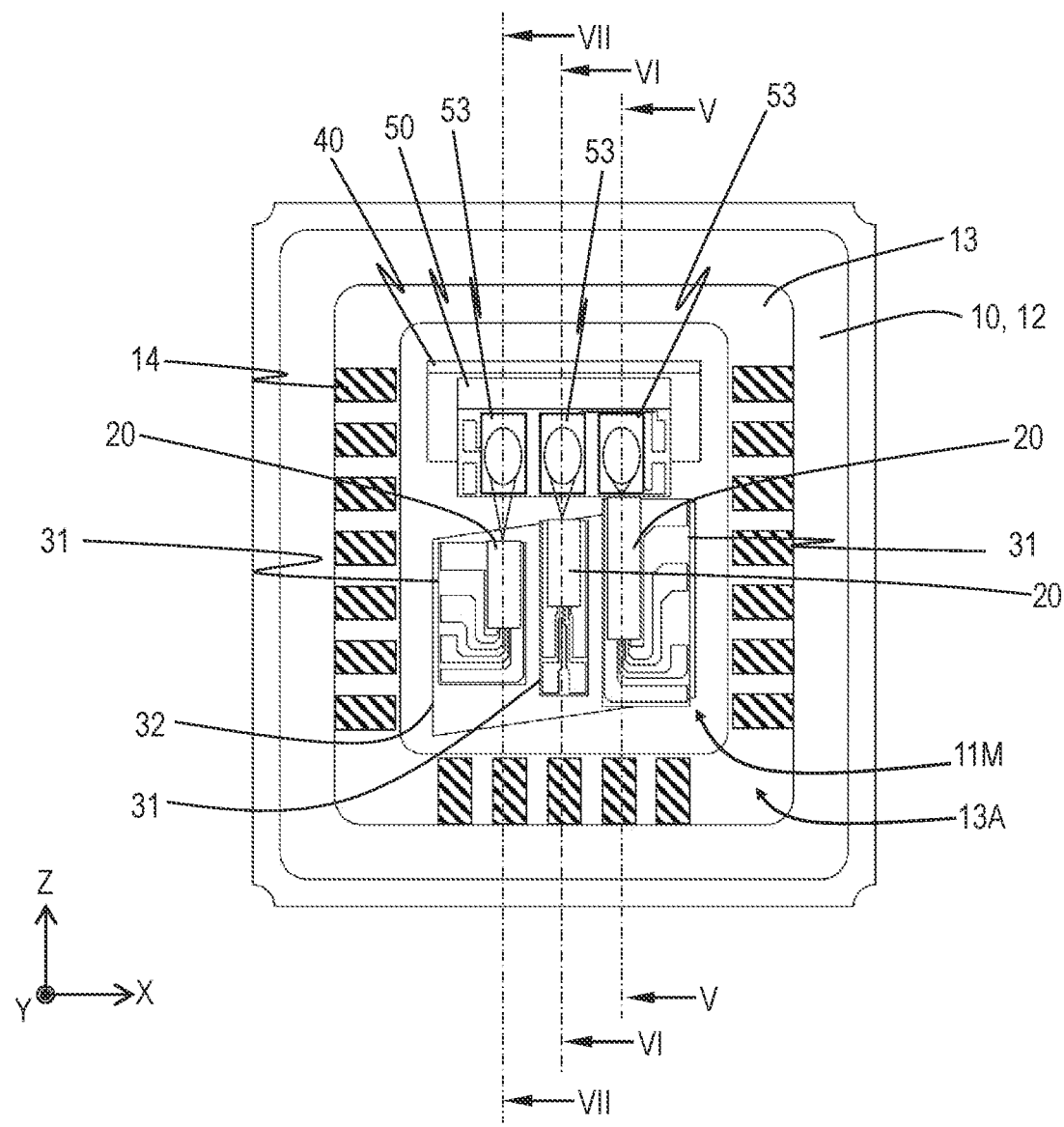
FIG. 3 is a schematic top plan view of the light-emitting device according to the first embodiment, in which the lid of the package is not shown.
Figure 4:
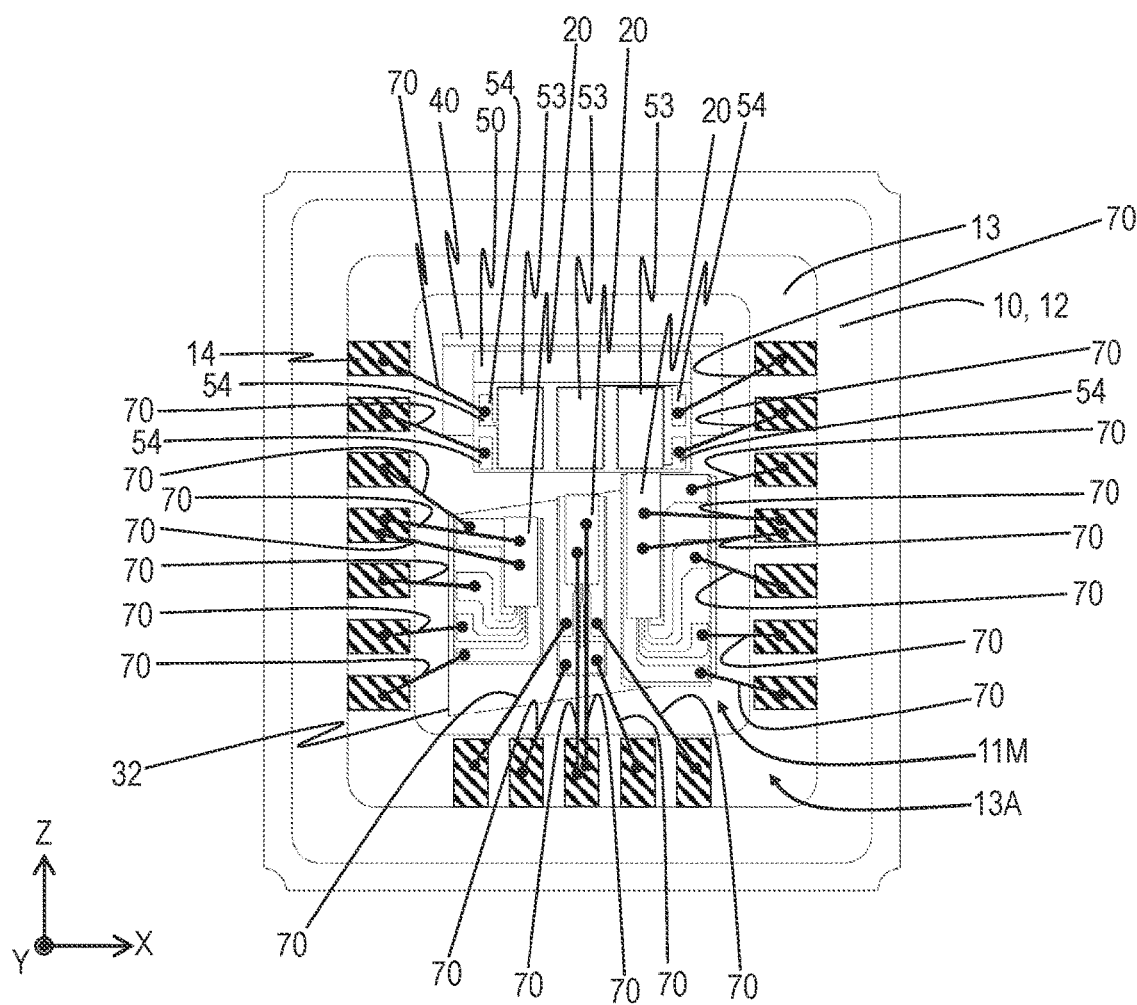
FIG. 4 is a schematic top plan view showing an example of wiring in the interior of the package.
Figure 5:
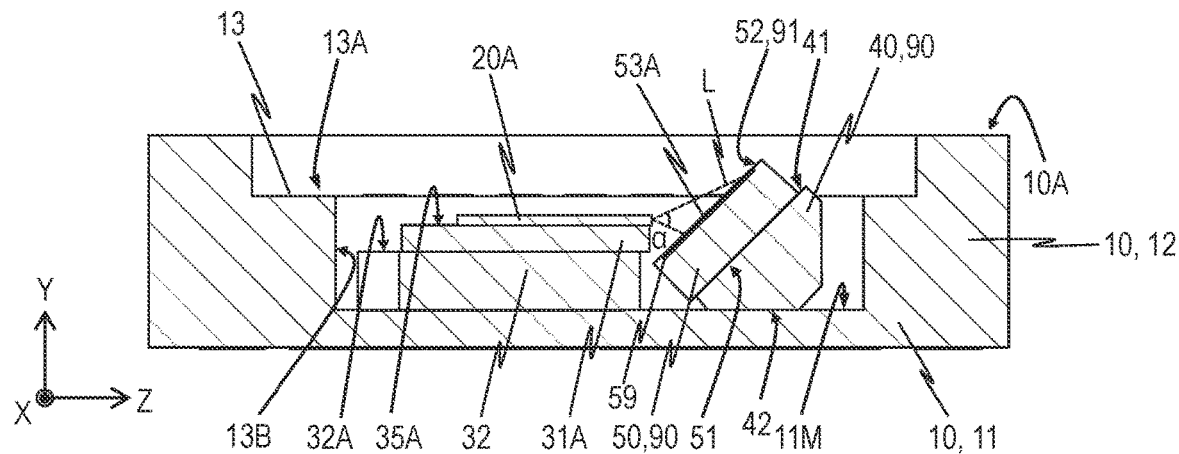
FIG. 5 is a schematic cross-sectional view taken along line V-V of FIG. 3.
Figure 6:
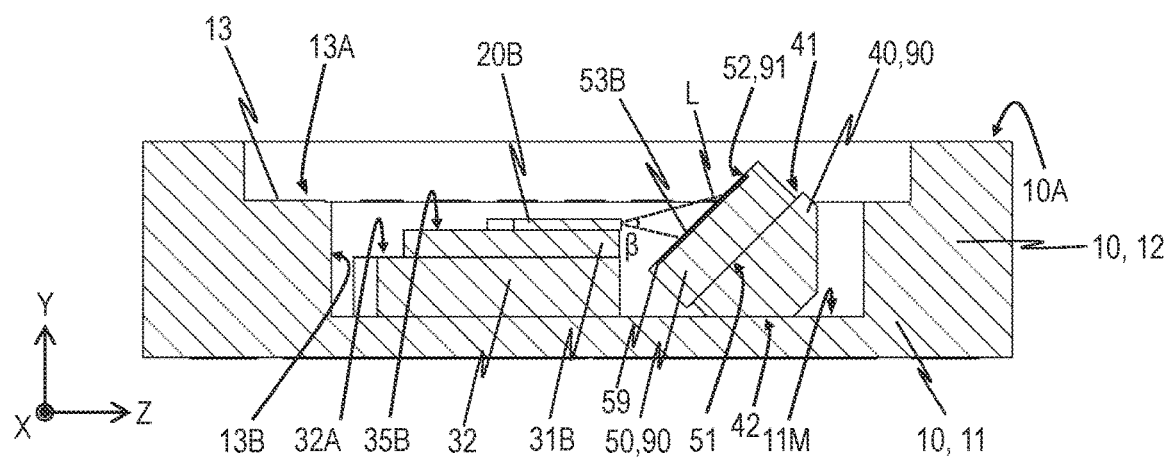
FIG. 6 is a schematic cross-sectional view taken along line VI-VI of FIG. 3.
Figure 7:
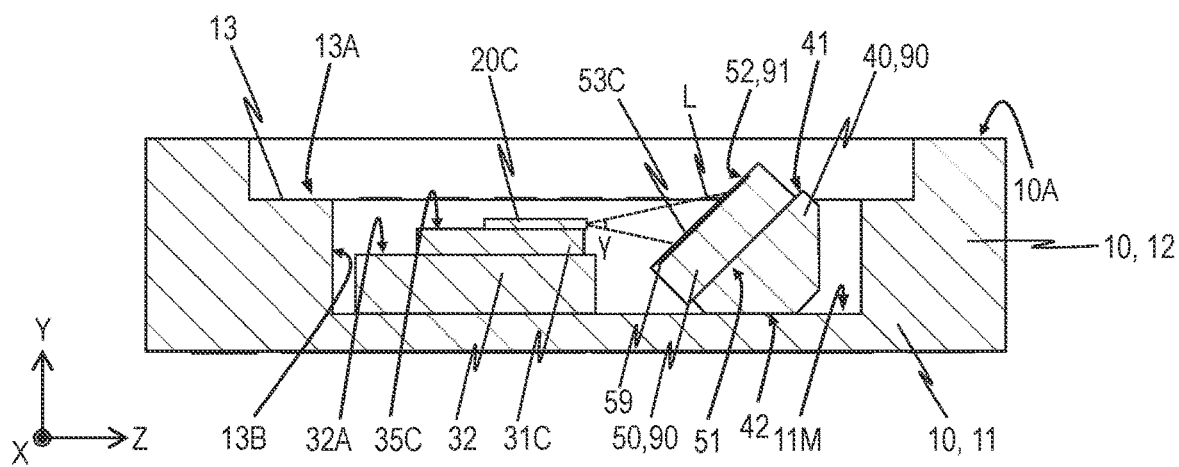
FIG. 7 is a schematic cross-sectional view taken along line VII-VII of FIG. 3.
Figure 8:
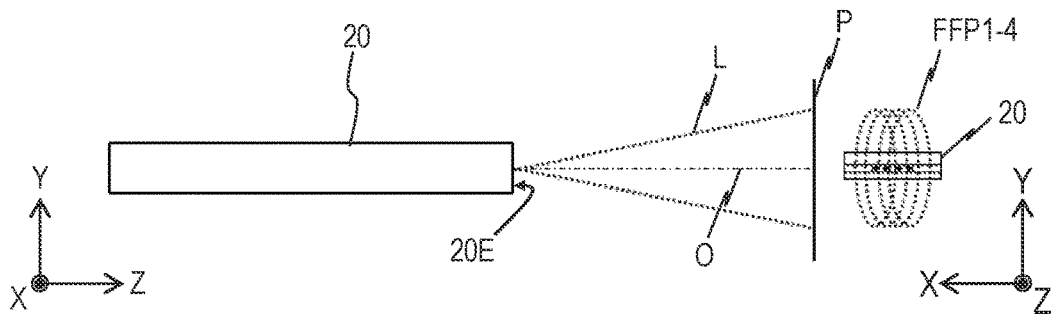
FIG. 8 is a diagram illustrating far field patterns of light emitted from a multimode light-emitting element exhibited on a plane in parallel to the emission end surface.
Figure 9A:
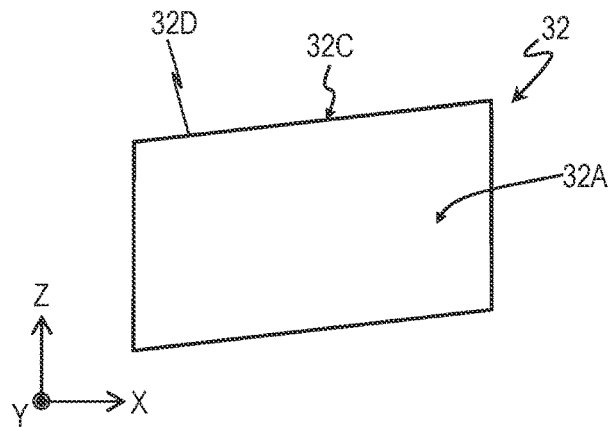
FIG. 9A is a schematic top plan view of a lower submount.
Figure 9B:
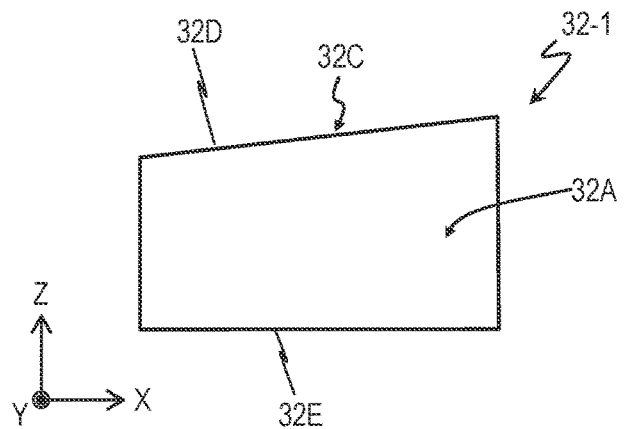
FIG. 9B is a schematic top plan view of another lower submount.
Figure 10A:
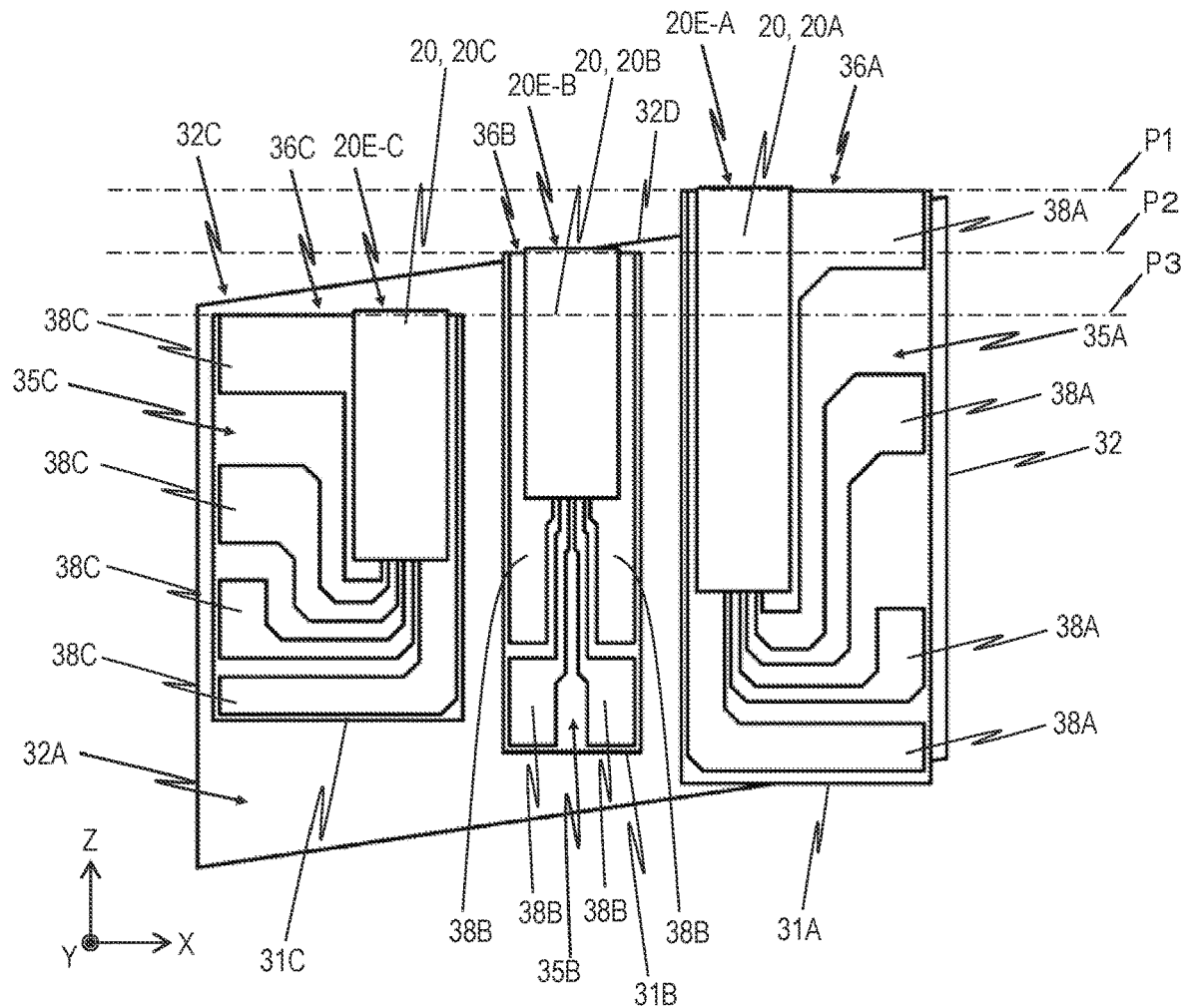
FIG. 10A is a schematic top plan view of a submount mounted with a plurality of light-emitting elements.
Figure 10B:
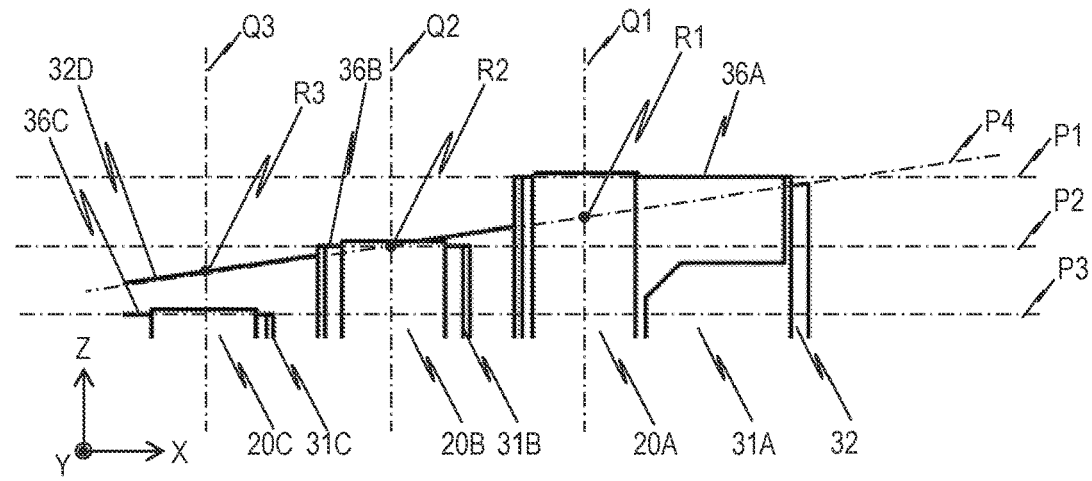
FIG. 10B is a schematic top plan view of an enlarged proximity of light-emitting points of a plurality of light-emitting elements mounted to the submounts respectively.
Figure 11A:
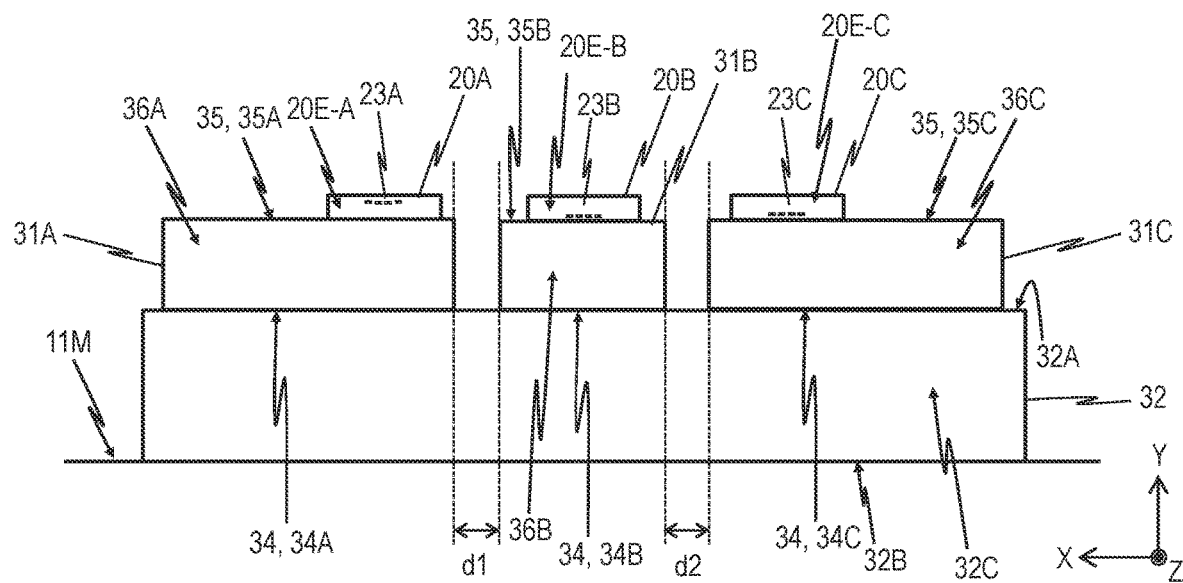
FIG. 11A is a schematic plan view illustrating an arrangement of submounts with a plurality of light-emitting elements mounted thereon, as viewed along the Z-axis from the positive direction.
Figure 11B:
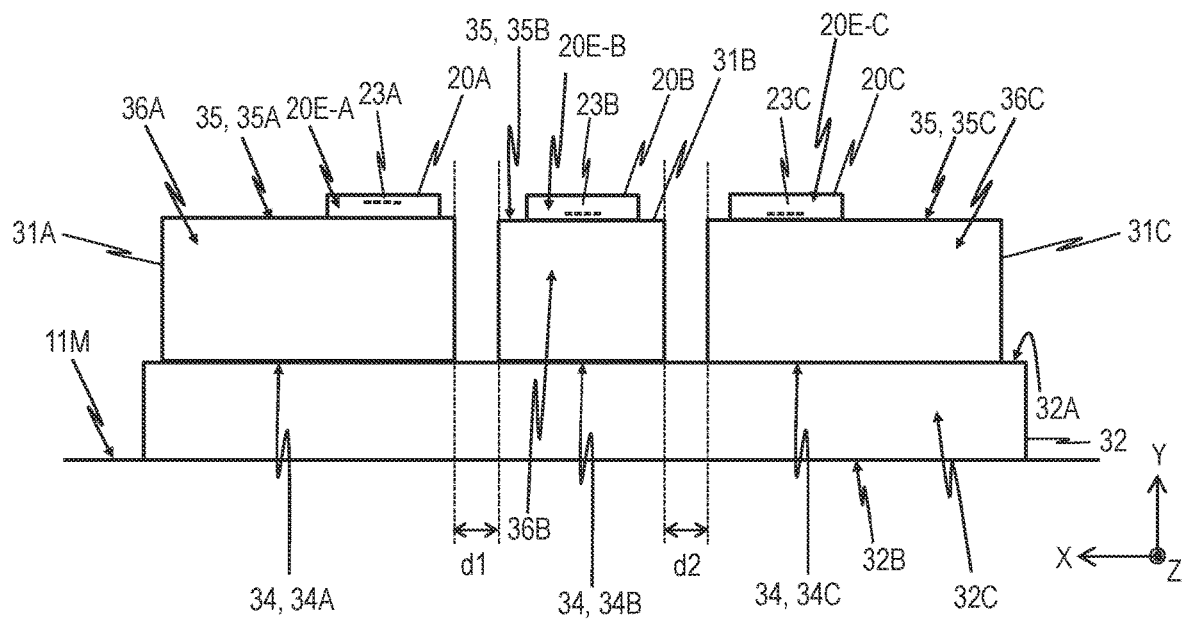
FIG. 11B is a schematic plan view illustrating another arrangement of submounts with a plurality of light-emitting elements mounted thereon, as viewed along the Z-axis from the positive direction.
Figure 12:
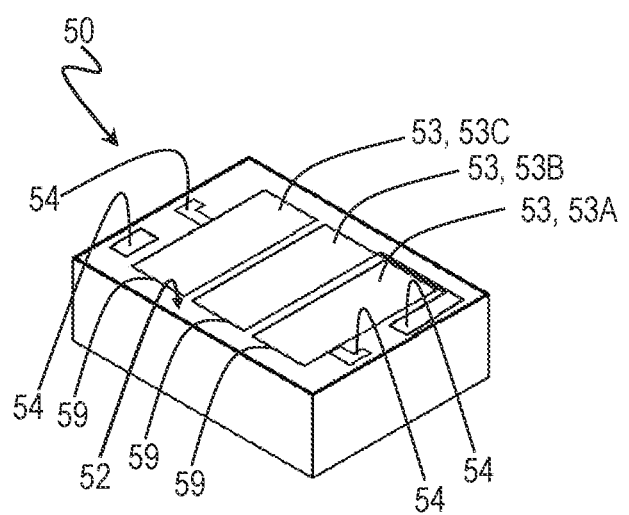
FIG. 12 is a schematic perspective view of a photodetector.

FIG. 1 is a schematic perspective view of the light-emitting device 100. FIG. 2 is a schematic perspective view of the light-emitting device 100, in which the lid 16 of the package 10 is not shown. FIG. 3 is a schematic top plan view of the light-emitting device 100, in which the lid 16 of the package 10 is not shown. In FIG. 3, regions to be irradiated with light on the light-receiving regions 53 of the photodetector 50 are indicated with broken lines. FIG. 4 is a schematic top plan view illustrating the wirings in the interior of the package 10. FIG. 5 is a schematic cross-sectional view taken along line V-V of FIG. 3. FIG. 6 is a schematic cross-sectional view taken along line VI-VI of FIG. 3. FIG. 7 is a schematic cross-sectional view taken along line VII-VII of FIG. 3. In FIG. 5 through FIG. 7, the light emitted from the light-emitting element 20 is shown as dashed lines. FIG. 8 is a diagram illustrating far field patterns of light emitted from a multimode light-emitting element 20 exhibited on a plane in parallel to the emission end surface. FIG. 9A is a schematic top plan view showing an example of the shape of the lower submount 32. FIG. 9B is a schematic top plan view showing another example of the shape of the lower submount 32. FIG. 10A is a schematic top plan view showing the lower submount 32 and a plurality of the upper submounts 31 mounted with a plurality of the light sources 20. FIG. 10B is a partially enlarged top plan view of portions in close proximity to the light-emitting points of the plurality of light-emitting elements 20 mounted on the plurality of upper submounts 31 respectively. FIG. 11A is a plan view, seen from a positive Z-axis direction, illustrating a configuration of the plurality of upper submounts 31 with the plurality of the light-emitting elements 20 respectively mounted thereon, and the lower submount 32. FIG. 11B is a plan view, seen from a positive Z-axis direction, illustrating another configuration of the plurality of upper submounts 31 with the plurality of the light-emitting elements 20 respectively mounted thereon, and the lower submount 32. FIG. 12 is a schematic perspective view of a photodetector 50.

The light-emitting device 100 according to the present embodiment includes a package 10, a plurality of light-emitting elements 20, one or more submounts, and a member 90 including a support block 40 and a photodetector 50. The one or more submounts may include a plurality of upper submounts 31 and a lower submount 32. The light-emitting device 100 can also include one or more protective elements and/or a temperature measuring element etc. Examples of the protective elements include a constant voltage diode such as a Zener diode. Examples of the temperature measuring element include a thermistor.

In the example of the light-emitting device 100 shown in the figures, a plurality of light-emitting elements 20, a plurality of upper submounts 31, a lower submount 32, a support block 40, and a photodetector 50 are accommodated in a package 10. Light emitted from each of the plurality of light-emitting elements 20 in the positive Z-axis direction is reflected in the positive Y-axis direction, i.e., an upward direction, at a corresponding one of the light-receiving regions 53 of the photodetector 50 secured on the support block 40 and transmits through the light-transmissive region of the package 10 and is emitted from the light extraction surface 17 to the outside. In the example configuration above, the Z-axis is in parallel to an imaginary straight line perpendicular to the emission end surface of each of the light-emitting elements 20, and the Y-axis is in parallel to an imaginary straight line that is perpendicular to the upper surface of each of the light-emitting element 20.

The components of the light-emitting device 100 will be described below.

Package 10

The package 10 includes a base portion 11 having a mounting surface 11M where certain components are located, one or more lateral wall portions 12 that surround the mounting surface 11M, and a lid 16 secured to the upper surface 10A of the lateral wall portions 12. The package 10 is formed with a recess defined by the mounting surface 11M and inner lateral surfaces of the lateral wall portions 12 of the package 10. The recess is formed in the upper surface of the package 10. In the present specification, a bottom surface in the recess may be referred to as an inner bottom surface. The inner bottom surface can be the main portion of the mounting surface 11M.

The package 10 has a rectangular outer shape in a top plan view seen from the direction perpendicular to the mounting surface 11M, that is, seen from the positive Y-axis direction. In the present specification, unless otherwise indicated, the term "top plan view" refers to a view from the positive Y-axis direction, or a view from a direction perpendicular to the upper surface 32A of the lower submount 32. The inner bottom surface of the package 10 has a rectangular peripheral shape. The package 10 has an outer shape that includes the peripheral shape of the inner bottom surface. Other than a rectangular shape, the outer surfaces described above may have any appropriate shapes.

The base portion 11 of the package 10 includes the mounting surface 11M. The base portion 11 includes the inner bottom surface and a lower surface of the package 10. The lateral wall portions 12 surround the mounting surface 11M and extend upward from the base portion 11. The lateral wall portions 12 include one or more outer lateral surfaces, one or more inner lateral surfaces, and an upper surface 10A extending from the outer lateral surface(s) and the inner lateral surface(s) of the package 10.

The package 10 can have one or more step portions 13. The one or more step portions 13 are formed in the recess of the package 10. Each of the one or more step portions 13 is formed with an upper surface 13A and an inner lateral surface 13B extending downward from the upper surface 13A. In other words, each of the one or more step portions 13 does not include an inner lateral surface extending upward from the upper surface 13A. Each of the one or more step portions 13 is a portion of the lateral wall portion 12 of the package 10. The one or more step portions 13 are located lower than the upper surface 10A of package 10. Each of the one or more step portions 13 has a step structure and can be formed along the inner lateral surface portion(s) of the package 10. The one or more step portions 13 can be formed along the entire perimeter of the inner lateral surface(s) of the lateral wall portion(s) 12 that surrounds the mounting surface. The one or more step portions 13 may be formed partially along the entire perimeter of the inner lateral surface(s) of the lateral wall portion(s) 12.

In a top plan view of the package 10 illustrated in the figures, the upper surface 13A of the step portion 13 has regions of different widths. The width of the upper surface 13A of the step portion 13 corresponds to a length perpendicular to the inner lateral wall surface of the package 10 at a portion of the upper surface 13A of the step portion 13 along the inner lateral wall portion of the package 10 along the X-axis direction or along the Z-axis direction in a top plan view. The step portion 13 has regions of different widths in a top plan view, in which the regions with greater width are referred to as the wider regions and the regions with smaller width are referred to as the narrower regions. In the example of the package 10 shown in the figures, the step portion 13 is formed along the four sides the rectangular shape in a top plan view, of which, the portions along three sides are wider regions and the portion along one side is narrower region. The upper surface of the step portion 13 may not have wider region(s) and narrower region(s). In that case, the portions of the upper surface of the step portion 13 along the four sides of the rectangular shape in a top plan view may have the same width.

In the example shown in FIG. 3 or FIG. 4, one or more wiring regions 14 are provided on the upper surface 13A of the step portion 13. The wider regions of the upper surface 13A are provided with one or more wiring regions 14. Meanwhile, the narrower region of the upper surface 13A is not provided with a wiring region 14. In FIG. 3 or FIG. 4, the same hatching is applied instead of the reference sign for all of the plurality of wiring regions. In the example of the package 10 shown in the figures, a plurality of wiring regions 14 are provided on the wider regions of the step portion 13. Each of the wiring regions 14 can be electrically connected, through inside of the package 10, to one or more wiring regions provided on the lower surface of the package 10. The wiring regions, which are electrically connected to the wiring regions 14, can be provided on the outer surface(s) (upper surface or outer lateral surface(s)) of the package 10, other than on the lower surface of the package 10.

The base portion 11 and the lateral wall portion 12 of the package 10 can be formed for example, using ceramic as the main material. Examples of ceramics include aluminum nitride, silicon nitride, aluminum oxide, and silicon carbide.

The package 10 can have a structure including the base portion 11 and the lateral wall portion 12 formed in one body. For example, it is possible to form a member with an integrated the base portion 11 and the lateral wall portion 12 using processing techniques such as molding or etching. The package 10 can be formed by joining the base portion 11 and the lateral wall portion 12 formed of different main materials. For example, the base portion 11 can be formed of a metal as a main material, and the lateral wall portion 12 can be formed of a ceramic as a main material. When the base portion 11 and the lateral wall portion 12 are formed of different main materials, the base portion 11 preferably includes a material of greater heat dissipation performance (greater thermal conductivity) than that of the ceramic used as the main material of the lateral wall portion 12. Examples of such materials for the base portion 11 include copper, aluminum, iron, copper molybdenum, copper tungsten, and copper-diamond composite materials.

The lid 16 has a lower surface and an upper surface, and has a rectangular flat plate shape. The lid 16 may not have a rectangular flat plate shape. The lid 16 is secured to the upper surface 10A of the lateral wall portion 12 above the base portion 11.

The lid 16 has a light extraction surface 17 that includes a light-transmissive region. A portion of the lid 16 may have a non-light-transmissive region that does not have light-transmissive property. The light extraction surface 17 is located as a portion of the upper surface of the lid 16. In the specification, the term "light-transmissive" refers to a transmittance of 80% or greater with respect to a main portion of light entering the region.

The lid 16 can be made of sapphire, for example. Sapphire has light-transmissive property, a relatively high refractive index, and a relatively high mechanical strength. The lid 16 may be made of a light-transmissive material such as glass, plastic, or quartz, other than sapphire.

For example, the package 10 may have a height of 3 mm or less in the Y-axis direction, and a length of 10 mm or less with respect to each side along the X- and Z-axes of the rectangular shape in a top plan view. For an alternative example, the package 10 may have a height of 2 mm or less, and each side of 7 mm or less of the rectangular shape in a top plan view.

Light-Emitting Element 20

Examples of the light-emitting element 20 include a semiconductor laser element (or a semiconductor laser diode). The light-emitting element 20 can have a rectangular shape in a top plan view. When the light-emitting element 20 is an edge-emitting semiconductor laser element, a lateral surface extending from one of two short sides of the rectangular shape is emission end surface 20E. The upper surface and the lower surface of the light-emitting element 20 each has a greater area than that of the emission end surface 20E. Other than an edge-emitting semiconductor laser element, the light-emitting element 20 may be a surface-emitting semiconductor laser element such as a vertical cavity surface emitting laser (VCSEL), or may be a light-emitting diode (LED).

The light-emitting element 20 according to the present embodiment has an emission end surface 20E including one or more light-emitting points, each of which emits light. In other words, the light-emitting element 20 has one or more light-emitting points. The light-emitting element 20 can be a single mode emitter having a single light-emitting point, or a multimode emitter having two or more light-emitting points. The light-emitting element 20 can have two, three, four or more light-emitting points. In the example shown in FIG. 8, a light-emitting element 20 which is a multimode emitter having four light-emitting points is illustrated.

When the light-emitting element 20 is an edge emitting semiconductor laser element, the light (laser light) emitted from the emission end surface 20E of the semiconductor laser element exhibits divergence. The laser light exhibits a far field pattern (hereinafter referred to as "FFP") having an elliptical shape on a plane parallel to the emission end surface 20E. The FFP is the shape or the optical intensity distribution of the emitted light at a position away from the emission end surface.

Light at the center of the elliptical shape of the FFP, in other words, light exhibiting the peak of the optical intensity distribution in the FFP, is referred to as light traveling along an optical axis. An optical path of light traveling along an optical axis can also be referred to as the optical axis of the light. In the optical intensity distribution in the FFP, light with intensity of $1/e^2$ or greater relative to the peak intensity value is referred to as "main portion" of light.

In the elliptical shape of the FFP of light emitted from the light-emitting element 20, which is a semiconductor laser element, the short-diameter direction of the ellipse is referred to as the slow-axis direction and the long-diameter direction is referred to as the fast-axis direction. A plurality of layers including an active layer that are constituents of a semiconductor laser element may be layered in the fast-axis direction.

Based on the optical intensity distribution in an FFP, an angle corresponds to $1/e^2$ of the intensity is referred to as an angle of divergence of the light of the semiconductor laser element. The angle of divergence of light in the fast-axis direction is called the angle of divergence of the fast-axis direction, and the angle of divergence in the slow-axis direction is called the angle of divergence of the slow-axis direction.

As shown in FIG. 8, the light L emitted from each of the four light-emitting points aligned in the X-axis direction of the light-emitting element 20 is spread out, and the FFP corresponding to each of the four light-emitting points is formed in a plane P parallel to the emission end surface 20E. FIG. 8 shows the optical axis O of the light L and the four FFPs 1-4 formed on the plane P. The X-axis direction is the slow-axis direction and the Y-axis direction is the fast-axis direction. The four FFPs 1-4 overlap on the plane P to form a shape that can be approximated to an elliptical shape. The smaller the distance between two adjacent light-emitting points, the closer the overall shape of the overlapping FFPs 1-4 is to an elliptical shape. The X-axis is in parallel to the emission end surface 20E of the light-emitting element 20, and also in parallel to the upper surface of the light-emitting element 20.

When the light-emitting element 20 is a multimode emitter, the plurality of light-emitting points are aligned along a single imaginary straight line in the emission end surface 20E. In each of the light-emitting elements 20A to 20C shown in FIG. 11A and FIG. 11B, the plurality of light-emitting points are aligned at the same interval and the same height from the lower surface of the light-emitting element.

For the light-emitting element 20, for example, a semiconductor laser element configured to emit blue light, a semiconductor laser element configured to emit green light, or a semiconductor laser element configured to emit red light can be employed. A semiconductor laser element configured to emit light other than those described above may also be employed.

In the present specification, blue light refers to light having a peak emission wavelength in a range of 420 to 494 nm. Green light refers to light having a peak emission wavelength in a range of 495 to 570 nm. Red light refers to light having a peak emission wavelength in a range of 605 to 750 nm.

Examples of semiconductor laser elements configured to emit blue light or green light include nitride-based semiconductor laser elements. Examples of nitride-based semiconductors include GaN, InGaN, and AlGaN. Examples of semiconductor laser elements configured to emit red light include InAlGaP-based semiconductor laser elements, GaInP-based semiconductor laser elements, GaAs-based semiconductor laser elements, and AlGaAs-based semiconductor laser elements.

Upper Submounts 31 and Lower Submount 32

The light-emitting device 100 according to the present embodiment includes a plurality of upper submounts 31 and a lower submount 32. Each of the upper submounts 31 and the lower submount 32 has, for example, a hexahedron shape. In the example shown in the figures, the upper submount 31 has a rectangular parallelepiped shape.

As shown in FIG. 11A and FIG. 11B, each of the upper submounts 31 has an upper surface 35 where other components can be arranged, and a lower surface 34 located at an opposite side to the upper surface 35. Similarly, the lower submount 32 has an upper surface 32A where the plurality of upper submounts 31 are arranged, and a lower surface 32B located at an opposite side to the upper surface 32A. The upper surfaces 35 and 32A, the lower surfaces 34 and 32B can function as bonding surfaces respectively.

In each of the upper submounts 31, the distance between the upper surface 35 and the lower surface 34, i.e., the thickness of the upper submount in the Y-axis direction, is less than the distance between the other two opposite surfaces. Similarly, in the lower submount 32, the distance between the upper surface 32A and the lower surface 32B, that is, the thickness of the lower submount in the Y-axis direction, is less than the distance between the other two opposite surfaces. The upper surface 32A of the lower submount 32 has an outer peripheral shape of a parallelogram, for example. The outer peripheral shape may have an appropriate shape other than a parallelogram shape.

In the example shown in FIG. 10A, each of upper surface 35 of the plurality of upper submounts 31 has a smaller area than the upper surface 32A of the lower submount 32. In the example shown in FIG. 11A, the lower submount 32 has a thickness greater than the thickness of each of the upper submounts 31 in the Y-axis direction. Each of the upper submounts 31 can have a thickness of, for example, about 0.2 mm. The lower submount 32 can have a thickness in a range of, for example, 1.5 to 4 times the thickness of any one of the upper submounts 31. For example, the lower submount 32 has a thickness of about 0.4 mm.

In the example shown in FIG. 11B, each of the upper submounts 31 has a thickness greater than the thickness of the lower submount 32 in the Y-axis direction. The lower submount 32 can have a thickness of, for example, about 0.2 mm. Each of the upper submounts 31 can have a thickness in a range of, for example, 1.5 to 4 times the thickness of the lower submount 32. For example, the lower submount 32 has a thickness of about 0.4 mm.

One or more the upper submounts 31 and the lower submount 32 can be formed using aluminum nitride or silicon carbide, respectively. The upper surfaces 35 and 32A or the lower surfaces 34 and 32B can be provided with a metal film for bonding, for example. Such a metal film can be made of Au for example. The upper submounts 31 and the lower submount 32 are made of the same material. The upper submounts 31 and the lower submount 32 may be made of different materials. When different materials are used, the thermal conductivity of the upper submounts 31 may be different from the thermal conductivity of the lower submount 32.

The lower surface 34 of each of the plurality of upper submounts 31 is bonded to the upper surface 32A of the lower submount 32 via a metal adhesive. The metal adhesive can be, for example, AuSn. As the example shown in FIG. 10A, a plurality of wiring regions electrically connected to other components are provided on the upper surface 35 of each of the plurality of upper submounts 31. The structures of the plurality of upper submounts 31 and the lower submount 32 will be described in detail below.

Member 90

The member 90 has an inclined surface 91. The inclined surface 91 can serve as a light-reflecting surface, a light-transmissive surface, or a light-receiving surface. In the present embodiment, the member 90 includes a support block 40 and a photodetector 50.

Support Block 40

The support block 40 includes a lower surface 42 and a support surface 41 inclined with respect to the lower surface 42. The support surface 41 is a flat surface inclined at an angle in a certain range with respect to the lower surface 42. The angle of inclination is, for example, in a range of 10 to 80 degrees, preferably in a range of 40 to 50 degrees. In the example of the light-emitting device 100 shown in the figures, the support surface 41 has an angle of inclination of 45 degrees with respect to the lower surface 42. The support surface 41 may include one or more inclined surfaces that are inclined with respect to the lower surface 42. In this case, the support surface 41 is the largest of the multiple incline surfaces.

The support block 40 can be made of, for example, ceramic, glass or metal. For example, ceramic such as aluminum nitride, glass such as quartz or borosilicate glass, metal such as aluminum can be employed. The support block 40 can also be made of silicon etc.

Photodetector 50

The photodetector 50 has a bonding surface 51, a light-receiving surface 52, and one or more lateral surfaces. The photodetector 50 is connected to one or more other components through the bonding surface 51 located at the opposite side from the light-receiving surface 52. The light-receiving surface 52 is located in the upper surface of the photodetector 50. In the example shown in the figures, the photodetector 50 has a rectangular parallelepiped outer shape. Other than a rectangular parallelepiped shape, the photodetector 50 can have other appropriate outer shape.

The light-receiving surface 52 of the photosensor 50 has a plurality of light-receiving regions 53. In the photodetector 50 shown in FIG. 12, three light-receiving regions 53 are provided in the light-receiving surface 52. The light-receiving surface 52 has a rectangular shape in a plan view, and similarly, each of the light-receiving regions 53 has a rectangular shape in a plan view. Other than a rectangular shape, the shape of the light-receiving regions 53 can be designed according to the shape of the light coming into each of the light-receiving regions 53.

The photodetector 50 has one or more wiring regions 54. The one or more wiring regions 54 are disposed on the light-receiving surface 52. The one or more wiring regions 54 may be disposed on one or more surfaces other than the light-receiving surface 52. Each of the wiring regions 54 is electrically connected to corresponding one or more of the light-receiving regions 53.

In the example shown in FIG. 12, four wiring regions 54 are disposed on the light-receiving surface 52 for electrical connection of the three light-receiving regions 53.

Wires 70

Each of the wires 70 has a line shaped portion with connection portions at both ends, and is made of an electrically conductive material. In other words, each of the wires 70 has a connection portion configured to be connected to other component at each end of a line shaped portion. The wires 70 may be made of a metal, the examples thereof include gold, aluminum, silver, and copper.

Light-Emitting Device 100

Next, the light-emitting device 100 will be described.

In the example of the light-emitting device 100 described below, each of the light-emitting elements 20 is of an edge-emitting type semiconductor laser element. Further, as shown in FIG. 8, each of the light-emitting elements 20 is a multimode semiconductor laser element having four light-emitting points on the emission end surface 20E. Other than four, the number of the light-emitting points can be appropriately determined. Also, Each of the light-emitting elements 20 may be a single mode semiconductor laser element.

In the present embodiment, the plurality of light-emitting elements 20 include first to third light-emitting elements 20A, 20B and 20C whose peak emission wavelengths differ from each other. The first light-emitting element 20A is configured to emit a first light having an emission peak at a first wavelength. The second light-emitting element 20B is configured to emit a second light having an emission peak at a second wavelength. The third light-emitting element 20C is configured to emit a third light having an emission peak at a third wavelength. The first wavelength, the second wavelength, and the third wavelength differ from each other. The first wavelength is longer than the second wavelength, and the second wavelength is longer than the third wavelength.

As shown in FIG. 11A or FIG. 11B, the first light-emitting element 20A has a first emission end surface 20E-A including four first light-emitting points 23A each being configured to emit the first light. The second light-emitting element 20B has a second emission end surface 20E-B including four second light-emitting points 23B each being configured to emit the second light. The third light-emitting element 20C has a third emission end surface 20E-C including four third light-emitting points 23C each being configured to emit the third light.

In the present specification, the first light is red, the second light is green, and the third light is blue. The optical axis of the first light, the optical axis of the second light, and the optical axis of the third light are in parallel to the Z-axis direction. In the present specification, the term "in parallel to" includes a tolerance within +/−2 degrees.

In the example shown in FIG. 10A, the second light-emitting element 20B is located between the first light-emitting element 20A and the third light-emitting element 20C in a top plan view. The length of the first light-emitting element 20A in the Z-axis direction is greater than the length of the second light-emitting element 20B or the third light-emitting element 20C in the Z-axis direction. By adjusting the lengths of the light-emitting elements 20 in the Z-axis direction, the output power of the laser light can be adjusted. The relationship between the lengths of the light-emitting elements 20 can be determined appropriately. The configuration employing three light-emitting elements 20 to emit three colors of light (RGB) can be used for color image display, for example. The color of light to be emitted by each of the light-emitting elements 20 can be appropriately determined, which may be other than visible light according to the application.

The lower submount 32 and the member 90 are disposed on the mounting surface 11M of the base member 11 of the package 10. Each of the plurality of light-emitting elements 20 is disposed on a corresponding one of the plurality of upper submounts 31. The plurality of upper submounts 31 including the first submount 31A, the second submount 31B, and the third submount 31C are disposed on the upper surface of the lower submount 32. As described above, in the present embodiment, the upper submounts 31 of the same number as the number of the light-emitting elements 20 are provided. The three light-emitting elements 20 are disposed on the three upper submounts 31 respectively.

The first submount 31A includes a first upper surface 35A where the first light-emitting element 20A is disposed, and a first lateral surface 36A extending from the first upper surface 35A and is located on the side of the first emission end surface 20E-A of the first light-emitting element 20A. The second submount 31B includes a second upper surface 35B where the second light-emitting element 20B is disposed, and a second lateral surface 36B extending from the second upper surface 35B and is located on the side of the second emission end surface 20E-B of the second light-emitting element 20B. The third submount 31C includes a third upper surface 35C where the third light-emitting element 20C is disposed, and a third lateral surface 36C extending from the third upper surface 35C and is located on the side of the third emission end surface 20E-C of the third light-emitting element 20C. The first lateral surface 36A and the first emission end surface 20E-A are located on the same side. The second lateral surface 36B and the second emission end surface 20E-B are located on the same side. The third lateral surface 36C and the third emission end surface 20E-C are located on the same side.

The first light-emitting element 20A, the second light-emitting element 20B and the third light-emitting element 20C are respectively bonded on the first upper surface 35A, the second upper surface 35B, and the third upper surface 35C via a metal adhesive. The material of the metal adhesive can be AuSn, for example.

The lower submount 32 includes an upper surface 32A, a lower surface 32B, and a front lateral surface 32C. The front lateral surface 32C is extending from the upper surface 32A. The first lower surface 34A of the first submount 31A, the second lower surface 34B of the second submount 31B, and the third lower surface 34C of the third submount 31C are bonded on the upper surface of the lower submount 32 via a metal adhesive.

The lower surface 32B of the lower submount 32 is bonded to the mounting surface 11M of the base member 11 via a metal adhesive. It is preferable that the metal adhesive above contains a metal having a melting point higher than that of AuSn and a lower bonding temperature. By using a metal adhesive having a low bonding temperature, the bonding can be performed at a relatively low temperature. With this bonding temperature, when the plurality of upper submounts 31 having a corresponding one of the plurality of light-emitting elements 20 mounted thereon are bonded on the lower submount 32, and then the lower submount 32 is bonded on the mounting surface 11M, damage of the light-emitting elements and unintended effects on the thermal characteristics of the light-emitting elements 20, caused by heating in bonding, can be reduced or prevented. The material of the metal adhesive can be Au particles, for example.

The front lateral surface 32C of the lower submount 32 is located on the same side as the first lateral surface 36A of the first submount 31A, the second lateral surface 36B of the second submount 31B, and the third lateral surface 36C of the third submount 31C.

In the present specification, the propagating direction along the optical axis of the first light, that is, the positive direction along the Z-axis, is indicated as a forward direction in a top plan view. The first emission end surface 20E-A of the first light-emitting element 20A is located forward of the second emission end surface 20E-B of the second light-emitting element 20B. The second emission end surface 20E-B of the second light-emitting element 20B is located forward of the third emission end surface 20E-C of the third light-emitting element 20C. The first lateral surface 36A of the first submount 31A is located forward of the second lateral surface 36B of the second submount 31B. The second lateral surface 36B of the second submount 31B is located forward of the third lateral surface 36C of the third submount 31C.

In the example shown in FIG. 9A, the upper surface 32A of the lower submount 32 has a parallelogram shape. Two facing sides of the parallelogram shape are in parallel to the first optical axis, that is, the Z-direction. The other two facing sides includes a side 32D that is an edge where the upper surface 32A meets the front lateral surface 32C. The side 32D is inclined with respect to the X-axis direction that is perpendicular to the optical axis of the first light and also in parallel to the mounting surface 11M. The angle of inclination may be in a range of 5 to 20 degrees. The four sides of the upper surface 32A having a parallelogram shape do not intersect each other at 90 degrees.

The lower submount 32 in the present disclosure does not need to have a parallelogram shape in a top plan view, and any appropriate shape can be employed according to the mounting conditions to a package. In this case, the optical axis of the first light, that is along the Z-axis direction, and the direction along the side 32D of the lower submount 32 also intersect at an angle other than 90 degrees. As an example shown in FIG. 9B, the lower submount 32-1 can have an upper surface 32A in a trapezoidal shape in a top plan view. Only a single side 32D of the lower submount 32-1 in a top plan view is inclined to the X-axis, and the side 32E opposite from the side 32D is not inclined to the X-axis. The side 32D of the lower submount 32 is inclined, for example, at an angle in a range of 5 to 20 degrees to the X-axis.

The first submount 31A, second submount 31B, and third submount 31C are arranged side by side along the X-axis direction on the upper surface 32A of the lower submount 32. The second submount 31B is arranged between the first submount 31A and the second submount 31C. The distance between two adjacent submounts among the first submount 31A, the second submount 31B, and the third submount 31C may be in a range of 1 to 100 μm. In the example shown in FIG. 11A or FIG. 11B, the distance d1 between the first submount 31A and the second submount 31B, and the distance d2 between the second submount 31B and the third submount 31C, are, for example, in a range of 1 to 100 μm.

As shown in FIG. 10A and FIG. 10B, the plane including the first lateral surface 36A of the first submount 31A is referred to as a plane P1 in the present specification. The plane including the second lateral surface 36B of the second submount 31B is referred to as a plane P2. The plane including the third lateral surface 36C of the third submount 31C is referred to as a plane P3. The plane P1 and the first emission end surface 20E-A are in parallel to each other. Also, the planes P1, P2 and P3 are in parallel to each other. Further, the first emission end surface 20E-A, the second emission end surface 20E-B, and the third emission end surface 20E-C are in parallel to each other. The X-axis and the first emission end surface 20E-A are in parallel to each other. In the present specification, the term "in parallel to" includes a tolerance within +/−2 degrees. Also, the plane including the front lateral surface 32C of the lower submount 32, and in parallel to the front lateral surface 32C is referred to as a plane P4. The plane P4 is not in parallel to the plane P1 and intersects with the plane P1 at an angle other than 90 degrees. The plane P4 can be inclined to the plane P1, for example, at an inclination angle in a range of 5 to 20 degrees. With the inclination angle of 5 degrees or greater, a portion of the divergent light emitted from the plurality of light-emitting elements 20 can be reduced or prevented from being irradiated on the upper surface 32A of the lower submount 32. With the inclination angle of 20 degrees or less, the contact area between the plurality of upper submounts 31 and the lower submount 32 can be increased, which allows for obtaining a light-emitting device having higher heat dissipating performance.

As shown in FIG. 10B, an imaginary straight line bisecting the first light-emitting element 20A along the Z-axis in a top plan view is referred to as an imaginary straight line Q1. An imaginary straight line bisecting the second light-emitting element 20B along the Z-axis in a top plan view is referred to as an imaginary straight line Q2. An imaginary straight line bisecting the third light-emitting element 20C along the Z-axis in a top plan view is referred to as an imaginary straight line Q3. The imaginary straight line Q2 and an imaginary straight line bisecting the second upper surface 35B of the second submount 31B along the Z-axis substantially overlap in a top plan view. The imaginary straight line Q1 is shifted toward the second light-emitting element 20B side from an imaginary straight line bisecting the first upper surface 35A of the first submount 31A along the Z-axis in a top plan view. The imaginary straight line Q3 is shifted toward the second light-emitting element 20B side from an imaginary straight line bisecting the third upper surface 35C of the first submount 31C along the Z-axis in a top plan view. By disposing the first light-emitting element 20A on the first upper surface 35A of the first submount 31A as described above, the first wiring region 38A can be disposed to a side of the first light-emitting element 20A. Similarly, by disposing the third light-emitting element 20C on the third upper surface 35C of the third submount 31C, the third wiring region 38C can be disposed to a side of the third light-emitting element 20C. On the upper surface of the second submount 31B, a second wiring region 38B is disposed mainly backward of the second light-emitting element 20B.

In the example shown in FIG. 4, one or more first wiring regions 38A are connected to a plurality of wiring regions 14 disposed on the wide region of the upper surface 13A of the step portion 13 via the wires 70 respectively. Similarly, one or more second wiring regions 38B and one or more third wiring regions 38C are connected via wires 70 to a plurality of wiring regions 14 disposed on the wide region of the upper surface 13A of the step portion 13 via the wires 70 respectively.

In FIG. 10B, the intersection of the plane P4 and the imaginary straight line Q1 is referred to as an intersection R1. The intersection of the plane P4 and the imaginary straight line Q2 is referred to as an intersection R2. The intersection of the plane P4 and the imaginary straight line Q3 is referred to as an intersection R3. The distance between the intersection R1 and the intersection R2 in the Z-axis direction is less than the distance between the first emission end surface 20E-A and the second emission end surface 20E-B in the Z-axis direction. The distance between the intersection R1 and the intersection R2 in the Z-axis direction is less than the distance between the plane P1 and the plane P2 in the Z-axis direction. Similarly, the distance between the intersection R2 and the intersection R3 in the Z-axis direction is less than the distance between the second emission end surface 20E-B and the third emission end surface 20E-C. The distance between the intersection R2 and the intersection R3 in the Z-axis direction is less than the distance between the plane P2 and the plane P3 in the Z-axis direction. Further, the distance between the intersection R1 and the intersection R3 in the Z-axis direction is less than the distance between the first emission end surface 20E-A and the third emission end surface 20E-C in the Z-axis direction. The distance between the intersection R1 and the intersection R3 in the Z-axis direction is less than the distance between the plane P1 and the plane P3 in the Z-axis direction. With the arrangement as described above, irradiation of a portion of light emitted from the first to third light-emitting elements 20A, 20B, and 20C on the upper surface 32A of the lower submount 32 can be reduced or prevented, and a contact area between the lower submount 32 and the first to third submounts 31A, 31B, and 31C can be increased. This allows for achieving a light-emitting device of higher heat dissipation performance.

An imaginary straight line connecting the midpoint of an edge between the upper surface and the first emission end surface 20E-A of the first light-emitting element 20A, and the midpoint of an edge between the upper surface and the second emission end surface 20E-B of the second light-emitting element 20B intersects the plane P1 at an angle in a range of 5 to 50 degrees, preferably in a range of 10 to 40 degrees. With the angle of 10 degrees or greater, the irradiation of the divergent light emitted from the first light-emitting element 20A and the second light-emitting element 20B, to the upper surface of the lower submount 32 can be further reduced or prevented. In particular, the irradiation of the divergent light emitted from the first light-emitting element 20A can be reduced or prevented. With the angle 40 degrees or less, the contact areas between the lower submount 32 and the first submount 31A, and between the lower submount 32 and the second submount 31B can be increased. In particular, the contact area between the lower submount 32 and the second submount 31B can be increased. This allows for higher heat dissipation performance of the light-emitting device.

In a top plan view, at least a portion of the first lateral surface 36A of the first submount 31A extends forward with respect to the front lateral surface 32C of the lower submount 32. In other words, in a top plan view, at least a portion of the first lateral surface 36A of the first submount 31A extends forward with respect to the edge 32D of the lower submount 32. With the first lateral surface 36A protruding forward with respect to the front lateral surface 32C, the irradiation of the divergent light emitted from the first light-emitting element 20A to the upper surface 32A of the lower submount 32 can be reduced or prevented. The third lateral surface 36C of the third submount 31C is located inward with respect to the front lateral surface 32C or the edge 32D. In the example shown in FIG. 10A or FIG. 10B, the distance between the intersection R1 and the plane P1 including the first lateral surface 36A in the Z-axis direction is greater than the distance between the intersection R2 and the plane P2 including the second lateral surface in the Z-axis direction. Also, the distance between the intersection R3 and the plane P3 including the third lateral surface 36C is greater than the distance between the intersection R2 and the plane P2 including the second lateral surface in the Z-axis direction. With the arrangement described above, the irradiation of divergent light emitted from each of the first to third light-emitting elements 20A, 20B, and 20C to the lower submount 32 can be reduced or prevented, while increasing the contact area between the plurality of upper submounts 31 and the lower submount 32. As a result, a submount structure with higher heat dissipation can be realized.

In the example shown in FIG. 11A, the four first light-emitting points 23A, the four second light-emitting points 23B, and the four third light-emitting points 23C are respectively aligned along the X-axis. The first light-emitting points 23A are located higher than the second light-emitting points 23B and the third light-emitting points 23C with respect to the upper surface 32A. The second light-emitting points 23B and the third light-emitting points 23C are located at the same height with respect to the upper surface 32A. All light-emitting points may be located at the same height with respect to the upper surface 32A.

In the direction perpendicular to the optical axis of the first light and in parallel to the mounting surface 11M of the base member 11, that is, in the X-axis direction in the example shown in the figures, the width of the second submount 31B is smaller than the width of the first submount 31A, and also smaller than the width of the third submount 31C. Accordingly, the distance between the second light-emitting element 20B and the first light-emitting element 20A can be reduced. The distance between the second light-emitting element 20B and the third light-emitting element 20C can also be reduced. For example, the width of the first submount 31A can be in a range of 400 to 1,100 μm. The width of the second submount 31B can be in a range of 100 to 800 μm. The width of the third submount 31C can be in a range of 400 to 1,100 μm.

By adopting such a numerical range, the first to third light-emitting elements 20A, 20B and 20C can be disposed on the upper surfaces of the first to third submounts 31A, 31B and 31C, respectively. Further, when the width of the first submount 31A in the X-axis direction is 400 μm or greater, the first wiring region 38A can be disposed lateral to the first light-emitting element 20A located on the upper surface 35A of the first submount 31A. When the width of the third submount 31C in the X-axis direction is 400 μm or greater, the third wiring region 38C can be disposed lateral to the third light-emitting element 20C located on the upper surface 35C of the third submount 31C. When the width of the second submount 31B in the X-axis direction is 800 μm or less, the first light-emitting points 23A and the third light-emitting points 23C can be located close to the second light-emitting points 23B. When the widths of the first submount 31A and the third submount 31C in the X-axis direction are 1,100 μm or less, the widths of the plurality of upper submounts 31 and the lower submount 32 in the X-axis direction can be reduced, allowing a reduction in the overall size of the light-emitting device can be reduced.

In the example shown in the figures, the first submount 31A has a length in the Z-axis direction that is greater than the lengths in the Z-axis direction of the second submount 31B, the third submount 31C, and the lower submount 32. The second submount 31B has a length in the Z-axis direction greater than the length in the axis direction of the third submount 31C. The relationship in the lengths of the submounts along the Z-axis direction can be appropriately set, for example, the length of the side of the lower submount 32 in the Z-direction may be greater than the length of the side of the first submount 31A in Z-direction.

at least one of the first light-emitting points 23A of the first light-emitting element 20A is located outward with respect to the edge 32D of the lower submount 32 in a top plan view. At least one of the third light-emitting points 23C of the third light-emitting element 20C is located inward with respect to the edge 32D of the lower submount 32 in a top plan view. The distance between the one or more first light-emitting points 23A and the intersection R1 in the Z-axis direction is greater than the distance between the one or more second light-emitting points 23B and the intersection R2 in the Z-axis direction. The distance between the one or more third light-emitting points 23C and the intersection R3 in the Z-axis direction is greater than the distance between the one or more second light-emitting points 23B and the intersection R2 in the Z-axis direction. With the arrangement described above, irradiation of a portion of divergent light emitted from each of the first to third light-emitting elements 20A, 20B, and 20C to the lower submount 32 can be reduced or prevented, while increasing the overlapping area between the lower submount 32 and the plurality of first to third light-emitting elements 20A, 20B and 20C. Accordingly, a submount structure with high heat dissipating properties can be realized.

In the present embodiment, the distance between the plane P1 and the plane P2, or between the plane P2 and the plane P3 can be, for example, in a range of 50 to 500 μm.

The member 90 is disposed on the mounting surface 11M of the base member 11. The member 90 is disposed on the mounting surface 11M such that the optical axis of the first light emitted from the first light-emitting element 20A intersects the inclined surface 91 of the member 90. The inclined surface 91 has three light-irradiating regions configured to be irradiated with the first light, the second light, and the third light respectively. Each of the FFPs of each of the first light, the second light, and the third light is respectively formed on a corresponding one of the light-irradiating regions. In the present embodiment, the member 90 includes a support block 40 and a photodetector 50, and the inclined surface 91 can serve as a light-receiving surface 52.

The lower surface 42 of the support block 40 is bonded to the mounting surface 11M of the base member 11. The support block 40 is disposed on the mounting surface 11M same as the lower submount 32 is also disposed. The lower surface 42 of the support block 40 is bonded to the mounting surface 11M, such that the support surface 41 is inclined to the mounting surface 11M. In the example shown in the figures, the support surface 41 is angled at 45 degrees with respect to the mounting surface 11M. The photodetector 50 is disposed on the mounting surface 11M of the base member 11 via the support block 40. The photodetector 50 can be disposed on the mounting surface 11M without being placed via the support block 40. When the photodetector 50 is disposed on mount surface 11M without being placed via the support block 40, the outer shape of the photodetector 50 may be altered to adjust the position (height) and/or orientation (tilt) of the light-receiving surface 52.

The support surface 41 of the support block 40 is bonded to the photodetector 50. The photodetector 50 is disposed on the support surface 41 of the support block 40. The support block 40 is disposed on the mounting surface 11M, with the support surface 41 facing toward the light-emitting element 20. Disposing the photodetector 50 on the mounting surface 11M via the support block 40 allows for simplifying the structure of the photodetector 50. Therefore, a material having higher shape-processability than the material for the photodetector 50 is preferably employed for the support block 40. In the example shown in the figures, the light-receiving surface 52 of the photodetector 50 is in parallel to the support surface 41.

As shown in FIG. 12, the light-receiving surface 52 of the photodetector 50 has the first to third light-receiving regions 53A, 53B, and 53C. A divergent light is emitted toward the light-receiving surface 52 from each of the light-emitting elements 20. The optical axis of each divergent light is in parallel to the mounting surface 11M. In the present specification, the term "in parallel to" includes a tolerance within +/−2 degrees. As shown in FIG. 3, each of the plurality of light-emitting elements 20A, 20B, and 20C irradiates a main portion of light on a corresponding one of the different regions of the light-receiving surface 52 of the photodetector 50. The first to third light-receiving regions 53A, 53B, and 53C are provided corresponding to the three light-receiving regions configured to be irradiated by the main portions of the first light to the third light.

The red light emitted from the first light-emitting element 20A irradiates the first light-receiving region 53A of the light-receiving surface 52. The green light emitted from the second light-emitting element 20B irradiates the second light-receiving region 53B of the light-receiving surface 52. The blue light emitted from the third light-emitting element 20C irradiates the third light-receiving region 53C of the light-receiving surface 52.

As illustrated in FIG. 5 to FIG. 7, the angle of divergence α of the red light emitted from the first light-emitting element 20A in the fast axis direction (or Y-axis direction) is greater than the angle of divergence β of the green light emitted from the second light-emitting element 20B in the fast axis direction. The angle of divergence α of the red light emitted from the first light-emitting element 20A in the fast axis direction is greater than the angle of divergence γ of the blue light emitted from the third light-emitting element 20C in the fast axis direction.

In the example shown in the figures, the distance between the first emission end surface 20E-A of the first light-emitting element 20A and the receiving surface 52 in Z-direction is less than the distance between the second emission end surface 20E-B of the second light-emitting element 20B and the receiving surface 52, or the distance between the third emission end surface 20E-C of the third light-emitting element 20C and the receiving surface 52. The first submount 31A on which the first light-emitting element 20A to emit red light that is the first light having a largest diverging angle in the fast axis direction is disposed most forward of the three upper submounts 31. This allows the first emission end surface 20E-A of the first light-emitting element 20A to be located close to the first light-receiving region 53A. With this arrangement, the first light emitted from the first light-emitting element 20A can be prevented from irradiating the mounting surface 11M of the base member 11 before reaching the first light-receiving surface 53A.

It is preferable to dispose the upper submounts 31 on the lower submount 32 to satisfy (1) to (3) described below.
(1) the first submount 31A mounted with the first light-emitting element 20A emitting a light having a relatively large angle of divergence in the fast axis direction is disposed to be protruded with respect to the edge 32D of the lower submount 32.
(2) at least a portion of the second submount 31B, mounted with the second light-emitting element 20B emitting a light having a smaller angle of divergence in the fast axis direction than that of the first light-emitting element 20A is disposed on the upper surface 32A of the lower submount 32, at a location inward with respect to the edge 32D of the lower submount 32.
(3) the third submount 31C mounted with the third light-emitting element 20C emitting a light having a smaller angle of divergence in the first direction than that of the first light-emitting element 20A is disposed on the upper surface 32A of the lower submount 32, at a location inward with respect to the edge 32D of the lower submount 32.

With the arrangement described above, irradiation of the divergent light from each of the light-emitting elements 20 to the upper surface 32A of the lower submount 32 or the mounting surface 11M can be reduced or prevented while exhibiting high heat dissipating performance Further, when the angles of divergence of light emitted from the second light-emitting element 20B and the third light-emitting element 20C are small, the arrangement described above allows for reducing the thickness of the upper submounts 31.

The photodetector 50 receives a portion of incident light to the light-receiving regions 53 and reflects a portion of the incident light. For example, each of the light-receiving regions 53 receives 2% or more of a main portion of the irradiated light. In addition, each of the light-receiving regions 53 reflects 80% or more of the main portion of the irradiated light. The sum of the received light and the reflected light is less than 100%.

The light emitted from each of the light-emitting elements 20 is reflected upward at a corresponding one of the light-receiving regions 53, passing through the light-transmissive regions of the lid 16 of the package 10, and then emitted from the light extraction surface 17 to the outside. Light emitted to the outside from the light extraction surface 17 can be used for screen display, for example. The central axis of the light extracted from the light extraction surface 17 is perpendicular to the light extraction surface 17. The term "perpendicular" as used above includes a tolerance within +/−2 degrees. But the central axis of the light may not necessarily be perpendicular to the light extraction surface 17. A portion of light emitted from each of the light-emitting elements 20 that is incident on a corresponding one of the light-receiving regions 53, is not reflected. The non-reflected portion of the light incident on each of the light-receiving regions 53 can be used as a monitor light to control the intensity of the laser light.

As illustrated in FIG. 5, a height of the upper surface 32A from the mounting surface 11M of the base portion 11 is greater than a height of a lowermost edge 59 of the light irradiation regions from the mounting surface 11M of the base portion 11 in a direction perpendicular to the upper surface 32A of the lower submount 32. With this arrangement, the first submount 31A mounted with the first light-emitting element 20A can be disposed closely the light-receiving surface 52 of the photodetector 50 not in contact with the light-receiving surface 52. The first light emitted from the first light-emitting element 20A can be prevented from hitting the mounting surface 11M of the base portion 11 before reaching the first light-receiving region 53A. In the example shown in FIG. 11A, a height of the lower submount 32 in the Y-axis direction is greater than a height of each of the plurality of upper submounts 31 in the Y-axis direction. Accordingly, the first submount 31A and the first light-emitting element 20A can be disposed stably on the upper surface 32A of the lower submount 32 and can be disposed closely to the light-receiving surface 52 of the photodetector 50. In the example shown in FIG. 11B, the height of each of the upper submounts 31 in the Y-axis direction is greater than the height of the lower submount 32 in the Y-axis direction. Accordingly, a portion of the divergent light emitted from each of the plurality of light-emitting elements 20 can be prevented from irradiating the upper surface 32A of the lower submount 32. The relationship between the relative heights of the lower submount 32 and the plurality of upper submounts 31 can be appropriately adjusted according to the effects as described above and ease of obtaining each component etc.

One or more first wiring regions 38A configured to be connected with one or more wires 70 are provided on the first upper surface 35A of the first submount 31A. The one or more first wiring regions 38A are located at an opposite side of the second light-emitting element 20B side across the first light-emitting element 20A on the first upper surface 35A. In the example shown in FIG. 10A, four first wiring regions 38A are provided, and connected to four wires 70 respectively. All the four connections are located on the positive X-axis direction side of the upper surface 35A of the first submount 31A bisected by the imaginary straight line Q1. Further in the example shown in FIG. 4, four wiring regions 14 electrically connected to the four first wiring regions 38A are located on the positive X-axis direction side of the wide regions extending in the Z axis directions in the upper surface 13A of the step portion 13.

Similarly, one or more third wiring regions 38C configured to be electrically connected with one or more wires 70 are provided on the third upper surface 35C of the third submount 31C. The one or more wiring regions 38C are located on an opposite side of the second light-emitting element 20B side across the third light-emitting element 20C on the third upper surface 35C. In the example shown in FIG. 10A, four third wiring regions 38C are provided, and electrically connected to four wires 70 respectively. All the four connections are located on the negative X-axis direction side of the upper surface 35C of the third submount 31C divided into two parts by the imaginary straight line Q3. Further in the example shown in FIG. 4, four wiring regions 14 electrically connected to the four third wiring regions 38C are located on the negative X-axis direction side of the wide regions extending in the Z-axis direction in the upper surface 13A of the step portion 13.

One or more second wiring regions 38B configured to be electrically connected with one or more wires 70 are provided on the second upper surface 35B of the second submount 31B. The one or more wiring regions 38B are provided on the second upper surface 35B, at a location opposite side of the second emission end surface 20E-B of the second light-emitting element 20B. In the example shown in FIG. 10A, four second wiring regions 38B are provided, each of which is electrically connected to a corresponding one of the four wires 70. The four second wiring regions 38B are arranged axisymmetrically relative to the imaginary straight line Q2 (shown in FIG. 10B) in a top plan view. The imaginary straight line Q2 is in parallel to the Z-axis, and bisects the light-emitting element 20B into two equal parts in a top plan view. The four connections between the four wires 70 and the four second wiring regions 38B are located axisymmetrically relative to the imaginary straight line Q2 on the second upper surface 35B of the second submount 31B. Further, the wiring regions 14 configured to be electrically connected to the second wiring regions 38B are located in the wide region extending in the X-axis direction of the upper surface 13A of the step portion 13. Arrangements of the wiring regions on the upper surface of each of the plurality of upper submounts 31 and/or arrangements of the wiring regions 14, which are disposed on the step portion 13 and configured to be electrically connected to the wiring regions 14 respectively, allows for a decrease in the size of the light-emitting device 100.

As illustrated in FIG. 4, the plurality of wires 70 electrically connect the plurality of light-emitting elements 20 and the photodetector 50 respectively with the wiring regions 14 of the package 10. One end of each of the wires 70 is bonded to a corresponding one of the wiring regions 14 provided on the wide region of the step portion 13. The other end of each of the wires 70 is bonded to a corresponding one of the wiring regions disposed on the upper surface 35 of the upper submounts 31, the p-side electrode or the n-side electrode of each of the light-emitting elements 20, or the wiring regions 54 located on the light-receiving surface 52 of the photodetector 50.

When the upper submounts 31 and the lower submount 32 have a same line expansion coefficient, bonding quality can be improved. Further, when the upper submounts 31 and the lower submount have a thermal conductivity greater than the thermal conductivity of the package 10, dispersion of heat can be improved.

In the light-emitting device 100 according to the present embodiment, the position of the light-emitting points of a plurality of light-emitting elements 20 can be arranged accurately.

Figure 13:
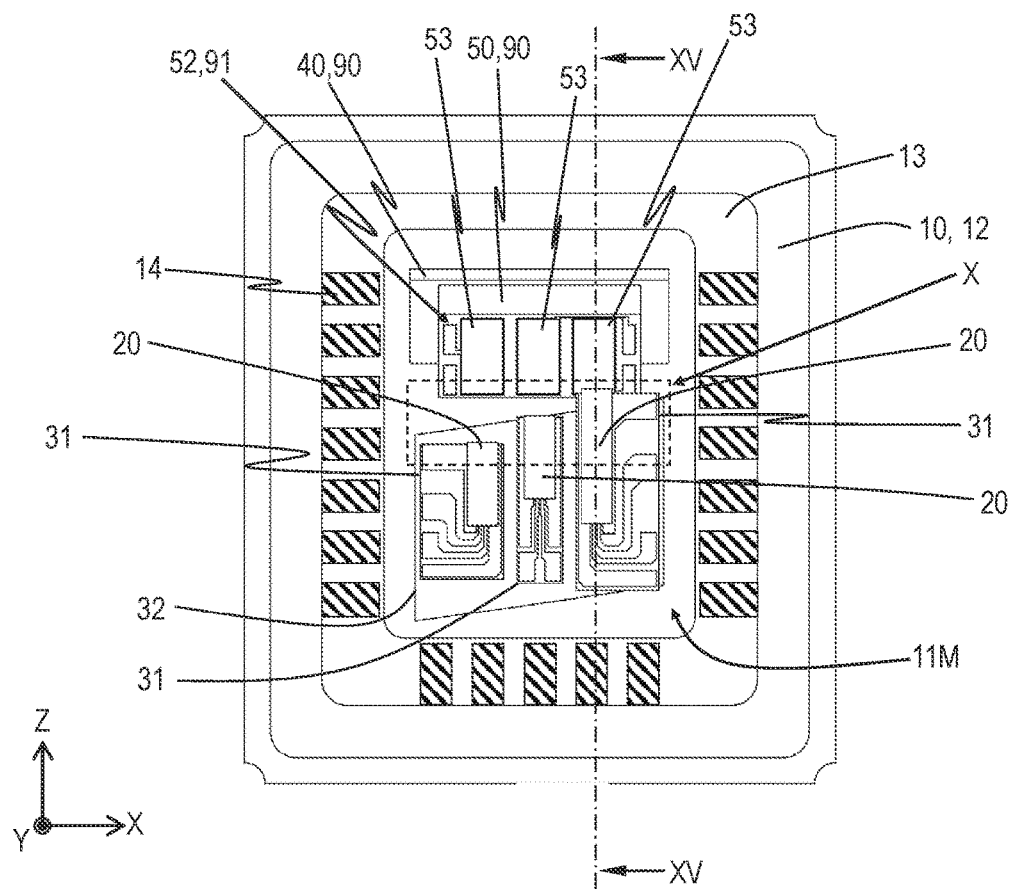
FIG. 13 is a schematic top plan view illustrating another slight-emitting device according to the first embodiment, in which the lid of the package is not shown.
Figure 14:
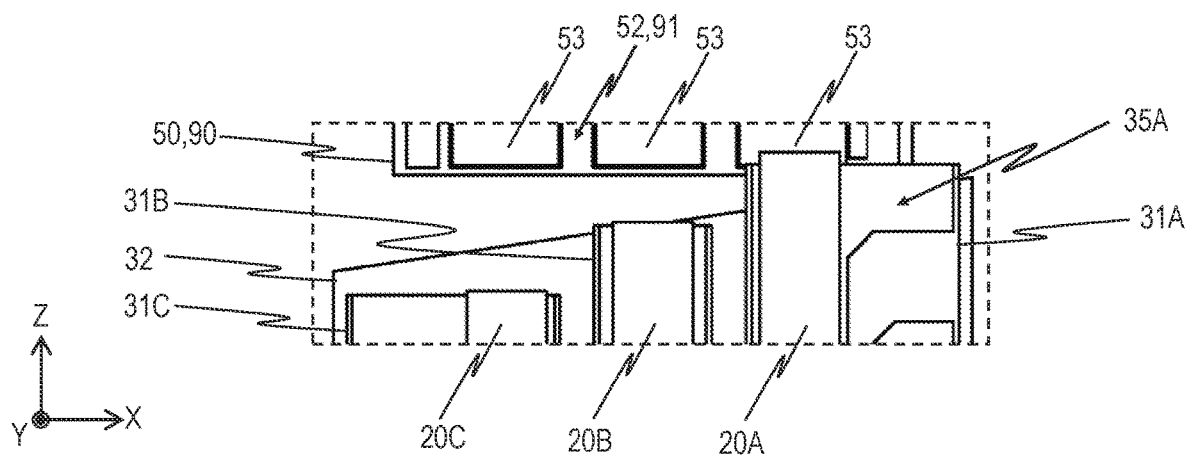
FIG. 14 is a partially enlarged view of an area X shown in FIG. 13.
Figure 15:
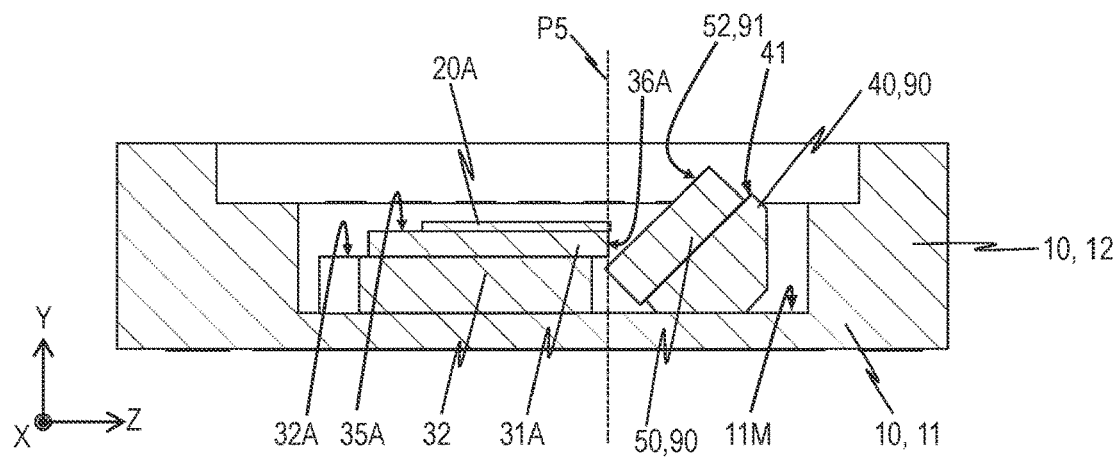
FIG. 15 is a schematic cross-sectional view taken along line XV-XV of FIG. 13.

FIG. 13 is a schematic top plan view illustrating another example of the light-emitting device 100, in which the lid 16 of the package 10 is not shown. FIG. 14 is a partially enlarged view of an area X shown in FIG. 13. FIG. 15 is a schematic cross-sectional view taken along line XV-XV of FIG. 13.

In another example of the light-emitting device 100, the first upper surface 35A of the first submount 31A partially overlaps the inclined surface 91 in a top plan view. In other words, a portion of the first upper surface 35A of the first submount 31A overlaps with a portion of the light-receiving surface 52 of the photodetector 50.

In the schematic cross-sectional view shown in FIG. 15, the plane P5 including a first lateral surface 36A of the first submount 31A intersects the light-receiving surface 52. Further, the light-receiving surface 52 is inclined at a predetermined angle relative to the mounting surface 11M of the base portion 11. The first emission end surface 20E-A of the first light-emitting element 20A can be arranged close to the light-receiving surface 52 of the photodetector 50. With this arrangement, the first upper surface 35A partially overlaps the light-receiving surface 52 of the photodetector 50. In particular, the light-emitting element configured to emit red light having wide divergence in the fast axis direction can be disposed closer to the light-receiving surface than that in the case shown in FIG. 5, for example. Accordingly, a portion of diverging light irradiated on the mounting surface 11M can be reduced or prevented.

In the light-emitting device 100, a closed-space is created in the package 10. Also, by bonding the lateral wall portion 12 and the lid 16 under a predetermined atmosphere, a hermetically sealed closed-space can be created in the package 10. By hermetically sealing the space accommodating the light-emitting elements 20, the quality degradation caused by accumulation of dust can be prevented. When the entire light-emitting device 100 is used in an environment or atmosphere where quality degradation caused by accumulation of dust, moisture in the air, or the like is negligible, the lid 16 is not necessary. For example, when the entire light-emitting device 100 is sealed in an enclosure, covering the light-emitting elements 20 by the lid 16 is not necessary.

In the present embodiment, one or more light-reflecting elements other than the photodetector 50 can be bonded to the support surface 41 of the support block 40. The light-reflecting element can be, for example, semiconductor elements having surfaces to obliquely receive at least portions of the first light, second light, and third light. Examples of such a semiconductor element other than a photodetector include a MEMS element. Examples of such a light-reflecting element include a light-reflecting mirror and a grating element.

A plurality of upper submounts 31 and the lower submount 32 can be obtained from plate-shaped submount substrates respectively, by singulating. A plurality of submounts having the same shape can be obtained from a single submount substrate. Singulating can be performed by dicing. Dicing can be blade dicing, laser dicing, or the like. Employing submounts with parallelogram shaped upper surfaces is also advantageous in the ease of manufacturing.

A plurality of upper submounts 31 are mounted on the lower submount 32. A plurality of light-emitting elements 20 are mounted on the plurality of upper submounts 31 respectively. A single light-emitting element 20 may be mounted on each of the upper submounts 31, then, a plurality of upper submounts 31 may be mounted on the lower submount 32, or a plurality of submounts 31 are mounted on the lower submount 32, then, a plurality of light-emitting elements 20 may be mounted on the plurality of upper submounts respectively. In the present example of manufacturing, for example, AlN is used for the upper submounts 31 and the lower sub-mount 32.

Second Embodiment

Figure 16:
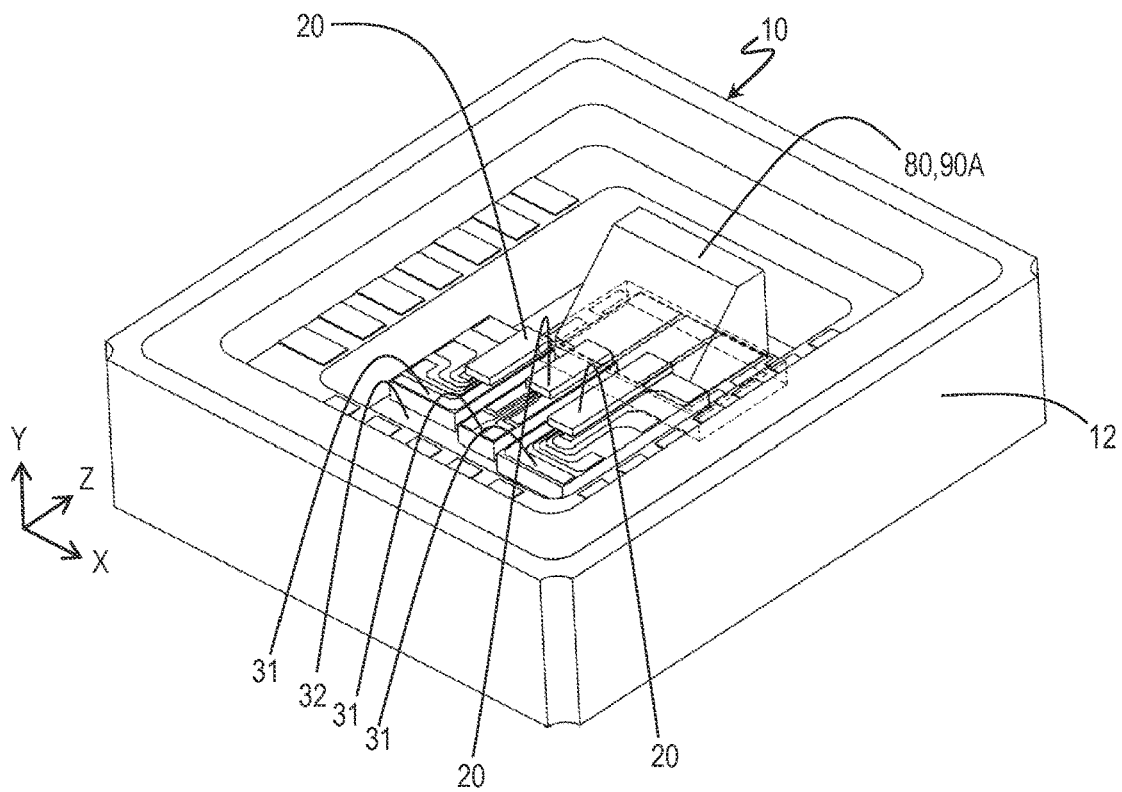
FIG. 16 is a schematic perspective view of a light-emitting device according to a second embodiment of the present invention, in which the lid of the package is not shown.
Figure 17:
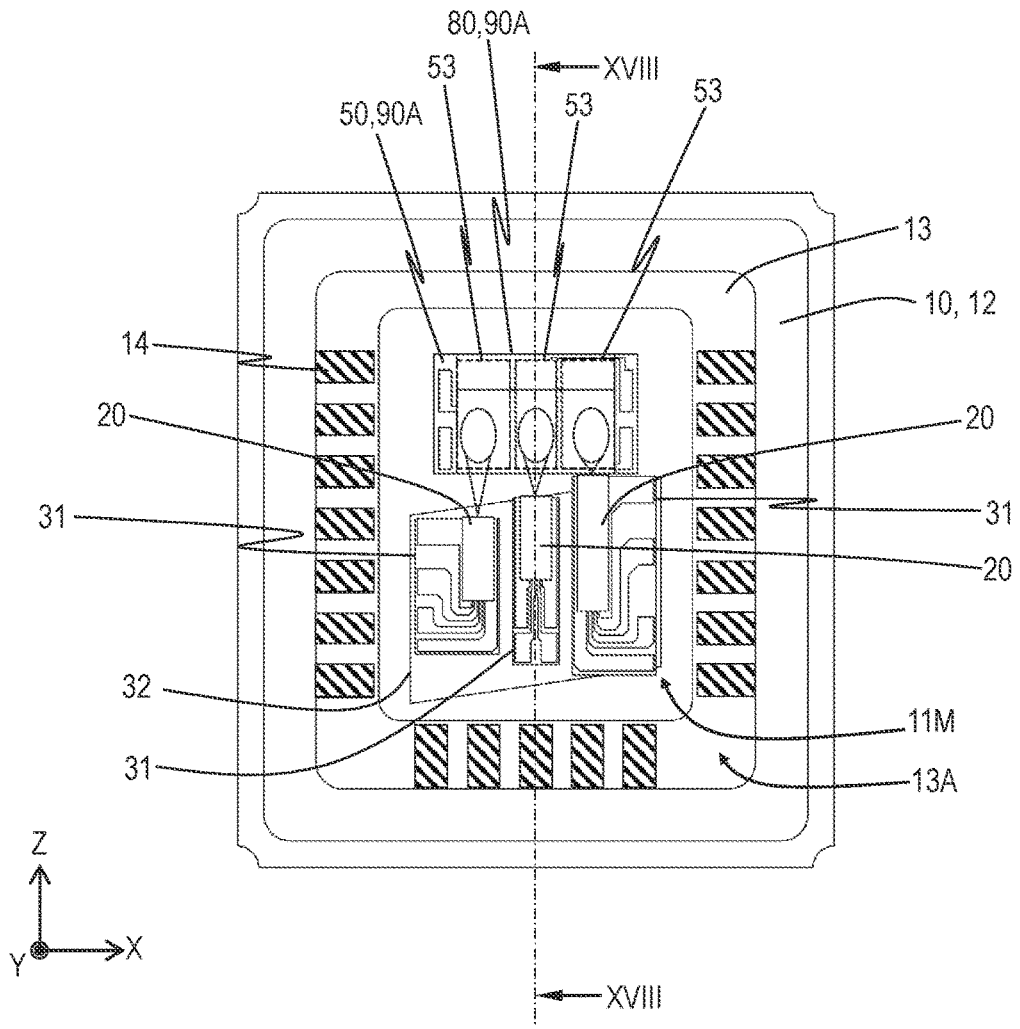
FIG. 17 is a schematic top plan view of the light-emitting device shown in FIG. 16, in which the lid of the package is not shown.
Figure 18:
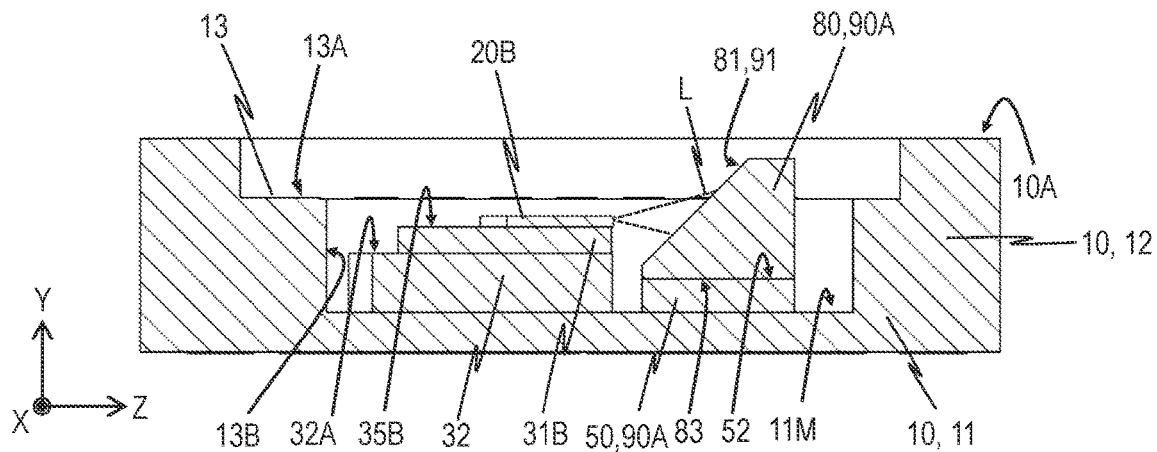
FIG. 18 is a schematic cross-sectional view taken along line XVIII-XVIII of FIG. 17.
Figure 19:
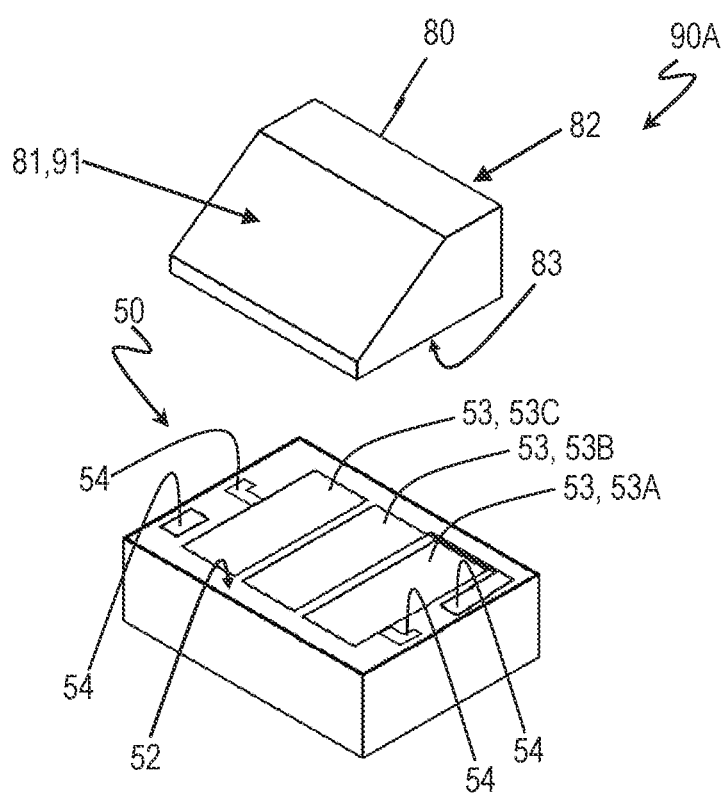
FIG. 19 is a schematic exploded perspective view of a member according to the second embodiment.

With reference to FIG. 1 and FIG. 16 to FIG. 19, a light-emitting device 200 according to a second embodiment will be described below. FIG. 1 is a schematic perspective view of the light-emitting device 200 according to the second embodiment, as of the light-emitting device 100 according to the first embodiment. FIG. 16 is a schematic perspective view of the light-emitting device 200, in which the lid 16 of the package 10 is not shown. FIG. 17 is a schematic top plan view of the light-emitting device 200, in which the lid 16 of the package is not shown. In FIG. 17, the light-receiving regions provided on the light-reflecting surface 81 of the optical member 80 is shown by broken lines. FIG. 18 is a schematic cross-sectional view taken along line XVIII-XVIII of FIG. 17. FIG. 19 is a schematic exploded perspective view of a member 90A.

The light-emitting device 200 according to the second embodiment differs from the light-emitting device 100 according to the first embodiment in that the member 90A of the light-emitting device 200 includes the photodetector 50 and an optical member 80. In the description below, the structure of the member 90 according to the present embodiment will be mainly described, and the description common to the first embodiment will be appropriately omitted.

The optical member 80 will be described below.
Optical Member 80

An example of the optical member 80 has a prism shape. A prism is a column body with a polygon as its base. Examples of the base of a column body include triangles, rectangles, and pentagons. Other than a prism shape, the shape of the optical member 80 can be appropriately determined. The optical member 80 may be formed with a light-transmissive material such as glass, plastic, or quartz. The optical member 80 may have a plurality of light-reflecting surfaces. In the present embodiment, the optical member 80 includes a light-reflecting surface 81, a light-reflecting surface 82, and a lower surface 83. The lower surface 83 can serve as a bonging surface to secure the optical member to other member.

The light-reflecting surface 81 is an inclined surface inclined with respect to the lower surface 83. The light-reflecting surface 81 is, for example, a flat surface inclined to the lower surface 83 at an inclination angle in a range of 25 to 65 degrees. In the light-emitting device 200 illustrated in the figures, the light-reflecting surface 81 is a flat surface with an inclination angle of 45 degrees relative to the lower surface 83. The light-reflecting surface 81 is a partial reflecting surface that passes through some of the incident light and reflects the rest. The light-reflecting surface 82 reflects a portion of light that has transmitted through the light-reflecting surface 81.

Each of the light-reflecting surface 81 and the light-reflecting surface 82 can be formed by, for example, disposing a light-reflection control film, which is configured to reflect predetermined portion of incident light, on a light-transmissive material. The light-reflection control film can be made of a metal film such as Ag, Al, or the like, for example. Alternatively, the light-reflection control film may be a dielectric multilayer film made of $Ta_2O_5/SiO_2$, $TiO_2/SiO_2$, $Nb_2O_5/SiO_2$, or the like. The reflectance or the light-transmittance of the light-reflecting surface can be adjusted by, for example, adjusting the thickness and/or the material of the light-reflection control film.

In the present embodiment, the light reflected from the light-reflecting surface 81 of the optical member 80 can be used as a main light for screen display etc. All or a portion of the light passed through the light-reflecting surface 81 can be used as a monitor light to control the intensity of the main light. In this case, the intensity of the monitor light is less than the intensity of the main light.

When lights having different colors are incident, for example, the light-reflecting surface 81 may have a plurality of incident regions corresponding respectively to each of lights. Each of the incident regions has a light-reflecting region configured to have a predetermined reflectance to the wavelength of the color of light. The plurality of light-reflecting regions corresponding respectively to the plurality of incident regions can be spaced apart from each other or may have a region where the plurality of light-reflecting regions partially overlap.

As illustrated in FIG. 19, the member 90A in the present embodiment includes a photodetector 50 and an optical member 80. The photodetector 50 described in the first embodiment can also be employed as the photodetector 50 in the present embodiment. In the example shown in FIG. 17 and FIG. 18, the photodetector 50 is disposed on the mounting surface 11M. The photodetector 50 is located between the lower submount 32 and the lateral wall 12 of the package 10. The photodetector is also located under the optical member 80. The photodetector 50 may have a length in the X-axis direction smaller than the length of the lower submount 32 in the X-axis direction. With this length of the photodetector 50, the distance between the lower submount 32 and the photodetector 50 in the Z-direction can be reduced. The lower surface 83 of the optical member 80 is bonded to the light-receiving surface 52 of the photodetector 50, for example, via an adhesive layer made of resin or the like.

In the present embodiment, the light-reflecting surface 81 of the optical member 80 functions as the inclined surface 91 of the member 90A. The light-reflecting surface 81 is arranged to face the light-emitting elements 20. The light-reflecting surface 81 is irradiated by the main portion of light emitted from the light-emitting elements 20. The light-reflecting surface 81 is configured to pass a portion of light emitted from the light-emitting elements 20 and reflect the rest upward. For example, the light-reflecting surface 81 reflects 90% or more of the incident light and allows the rest of less than 10% of the incident light to pass through. The area of the light-reflecting surface 81 is greater than the area of the light-receiving surface 52. With this area of the light reflecting surface 81, most of the light emitted from the light-emitting elements 20 can be irradiated on the light-reflecting surface 81 even when the distance between the light-emitting points of the light-emitting elements 20 and the light-reflecting surface 81 is large. Also, the height of the light-receiving surface 52 from the mounting surface 11M is smaller than that of the upper surface 32A of the lower submount 32 from the mounting surface 11M. With this arrangement, the upper submount 31 and the light-emitting elements 20 can be located close to the light-reflecting surface 81. The light-reflecting surface 82 is configured to reflect a portion or all of the light passed through the light-reflecting surface 81. For example, the light-reflecting surface 82 can reflect 99% or more of the incident light. The light reflected from the light-reflecting surface 82 is mainly directed toward the lower surface 83.

The light-receiving regions 53 of the photodetector 50 receive light passed through the light-reflecting surface 81 of the optical member 80. In a top plan view, the area of the light-receiving surface 52 of the photodetector 50 is less than the area of the upper surface 32A of the lower submount 32. The light-receiving surface 52 of the photodetector having such an area allows for a reduction in the size of the light-emitting device 200 while dissipating heat generated due to incident light.

Third Embodiment

Figure 20:
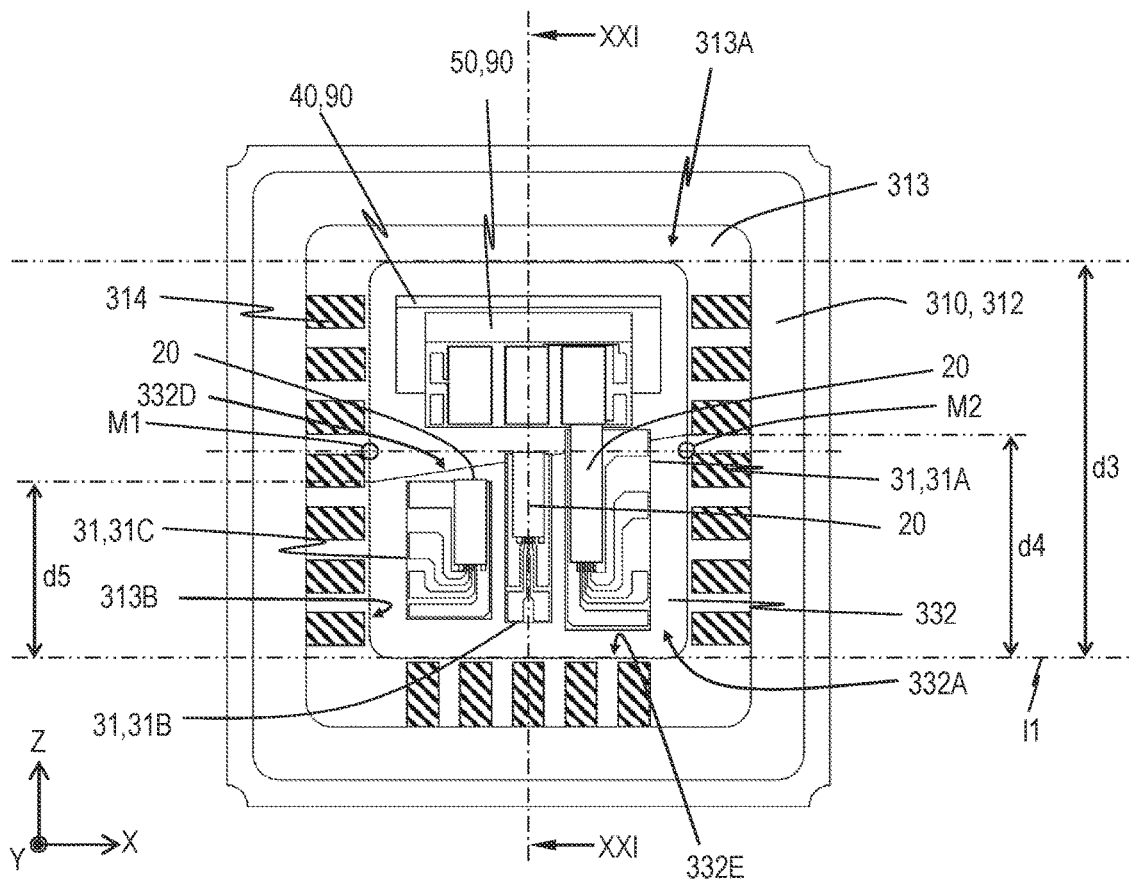
FIG. 20 is a schematic top plan view of a light-emitting device according to a third embodiment of the present invention, in which the lid of the package is not shown.
Figure 21:
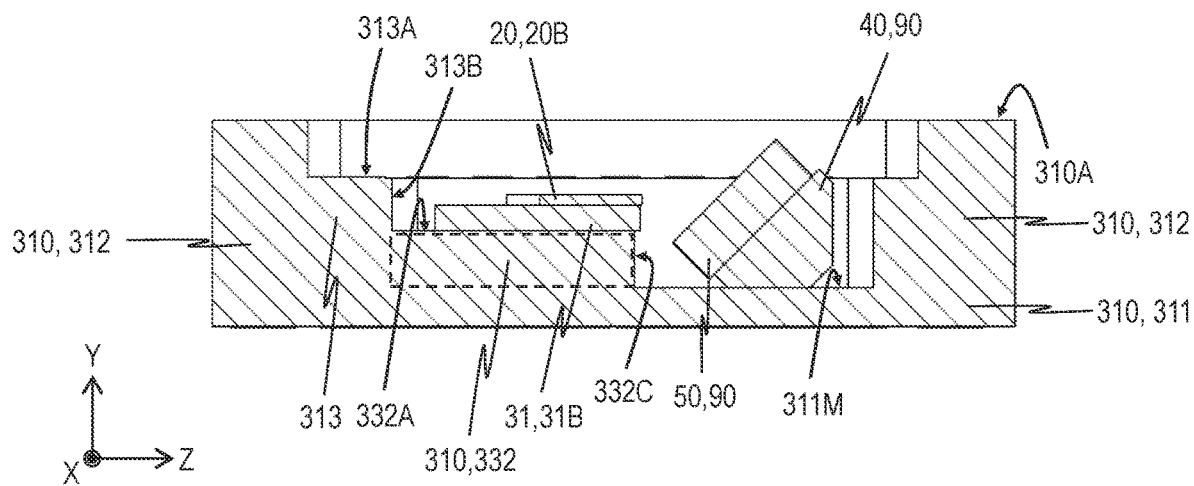
FIG. 21 is a schematic cross-sectional view taken along line XXI-XXI of FIG. 20.

With reference to FIG. 1, FIG. 20, and FIG. 21, a light-emitting device 300 according to a third embodiment will be described below. Similarly to the light-emitting device 100 according to the first embodiment, a schematic perspective view of a light-emitting device 300 according to the third embodiment is shown in FIG. 1. FIG. 20 is a schematic top plan view of the light-emitting device 300, in which the lid 316 of the package 310 is not shown. FIG. 21 is a schematic cross-sectional view taken along line XXI-XXI of FIG. 20.

The light-emitting device 300 according to the present embodiment includes a package 310 having a protruding portion 332, a plurality of light-emitting elements 20, one or more submounts 31, and a member 90 (or a member 90A) including a support block 40 and a photodetector 50. The light-emitting device 300 in the present embodiment differs from the light-emitting device 100 according to the first embodiment, in that the package 310 has the protruding portion 332, but does not have a lower submount. In the description below, the structure of the package 310 provided in the light-emitting device 300 according to the present embodiment will be mainly described, and description of the same or similar structure to those in the first embodiment will be appropriately omitted.

Now, the structure of package 310 will be described below.

Package 310

The package 310 includes a base portion 311 having a mounting surface 311M, a lateral wall portion 312 having an upper surface 310A and inner lateral surfaces each extending from the upper surface, outer lateral surfaces each extending from the upper surface, a protruding portion 332 including an upper surface 332A and a front lateral surface 332C, and a lid 316 (FIG. 1) having a light extraction surface 317 and secured to the upper surface 310A. The inner lateral surfaces and the mounting surface define a recess.

With reference to FIG. 21, components of the package 310 will be described.

In FIG. 21, the protruding portion 332 of the package 310 is shown with a dashed rectangular box, for the sake of illustration. In the present embodiment, the portion of the package 310 located lower than the mounting surface 311M is referred to as a base portion 311. The lateral wall portion 312 is a portion of the package 310 located higher than the mounting surface 311M. A step portion 313 is formed in the lateral wall portion 312. In the example shown in the figures, the portion of the package 310 located higher than the mounting surface 311M and between the inner lateral surfaces 313B of the step portion 313 and the outer lateral surfaces is referred to as a lateral wall portion 312. Further, a portion of the package 310 located higher than the mounting surface 311M and inward relative to the inner lateral surfaces defining the recess of the package 310 (in the example shown in the figures, the inner lateral surfaces 313B of the step structure 313) is referred to as the protruding portion 332.

In the example shown in the figure, the base portion 311, the protruding portion 332, and the lateral wall portion 312 of the package 310 are formed in one body. The base portion 311 and the protruding portion 332 may be formed in one body, and the lateral wall portion 312 may be formed as separate component. The upper surface 332A of the protruding portion 332 and the inner lateral surfaces of the lateral wall portion 312 can be connected and the front lateral surface 332C of the protruding portion 332 and the mounting surface 311M of the base portion 311 can be connected. In the example shown in the figures, the upper surface 332A of the protruding portion 332 and the inner lateral surfaces 313B of the step portion 313 that are included in the lateral wall portion 312 are connected. The upper surface 313A of the step portion 313 is located higher than the upper surface 332A of the protruding portion 332. The protruding portion 332 has an edge 332D that connects the upper surface 332A and the front lateral surface 332C. A plurality of wiring regions 314 are disposed on the upper surface 313A of the step portion 313. The upper surface 332A of the protruding portion 332 does not have to be connected to the lateral wall portion 312. For example, the protruding portion 332 may have a back lateral surface on the opposite side of the front lateral surface 332C and connected to the mounting surface 311M and facing the inner lateral surface 313B.

Light-Emitting Device 300

Next, a light-emitting device 300 according to the present embodiment will be described below. A plurality of submounts 31 are disposed on the upper surface 332A of the protruding portion 332. In the example shown in FIG. 20, the first submount 31A, the second submount 31B, and the third submount 31C, as in the first embodiment, are disposed on the upper surface of the protruding portion 332. In the same way as the arrangement of the plurality of upper submounts 31 on the lower submount 32 in the first emitter 100, and the positional relationship between each of the upper submounts 31 and the edge 32D of the lower submount 32, the plurality of submounts 31 in the light-emitting device 300 can be disposed on the upper surface 332A of the protruding portion 332.

In the light-emitting device 300, the protruding portion 332 is disposed in the package 310 such that the inner lateral surfaces of the lateral wall portion 312 and the upper surface 332A of the protruding portion 332 are connected, as described above. In the example shown in the figures, the inner lateral surfaces 313B of the step portion 313 and the upper surface 332A of the protruding portion 332 are connected. With the arrangement described above, the dimensions of the light-emitting device 300 in the X-direction and/or the Z-direction can be reduced. The description below will be given with reference to the examples shown in the figures.

More specifically, the upper surface 332A of the protruding portion 332 and the inner lateral surface 313B of the step portion 313 extending in the X-direction are connected. This arrangement does not allow the presence of a member or a space between the protruding portion 332 and the step portion extending in the X-direction, allowing for a reduction in the size of the light-emitting device 300 in the Z-direction. It is also possible to connect the upper surface 332A of the protruding portion 332 with at least one or both inner lateral surfaces 313B of the step portion 313 extending in the Z-direction. This arrangement does not allow the presence of a member or a space between the protruding portion 332 and the step portion 313 extending in the Z-direction, allowing for a reduction in the size of the light-emitting device 300 in the X-direction. As described above, the protruding portion 332 can be disposed such that the upper surface 332A of the protruding portion 332 is not connected with the lateral wall portion 312 and/or the step portion 313.

In the light-emitting device 300 illustrated in the figures, assuming the mid-points M1 and M2 of the two sides extending in the Z-direction, of the sides where the inner lateral surface 313B of the step portion 313 and the upper surface 313A of the step portion 313 meets. In the top plan view, an imaginary straight line passing through the mid-points M1 and M2 intersects the side 332D. The angle between the imaginary straight line and side 332D is, for example, in a range of 5 to 20 degrees.

In the light-emitting device 300 illustrated in FIG. 20, the distance in the Z-direction between the two inner lateral surfaces 313B of the step portion 313 extending in the X-direction is indicated as the distance d3. The distance d3 can be 1.8 times or less with respect to the length of the first submount 31A in the Z-direction. Of the edges where the inner lateral surfaces 313B of the step portion 313 and the upper surface 313A of the step portion meet, one of two edges extending in the X-direction and located on opposite side from the emission end surfaces of the light-emitting elements 20 is indicated as the edge 332E. Assuming imaginary line segments connecting a point on an imaginary straight line L1 that contains the edge 332E and a point on the edge 332D and in parallel to the Z-direction of those, the distance between the two points of the longest line segment is indicated as the distance d4. The distance d3 can be less than or equal to twice the distance d4, for example. Further, assuming line segments connecting a point on the line L1 and a point on the edge 332D and in parallel to the Z-direction, of those, the distance between the two points of the shortest line segment is indicated as the distance d5. The distance d5 can be less than or equal to three times the distance d5, for example.

The member 90 or the member 90A is disposed on the mounting surface 311M of the base portion 311. FIG. 21 illustrates an example of the member 90 disposed on the mounting surface 311M. The positional relationship or relationship in the length between the plurality of submounts 31 and the plurality of light-emitting elements 20 disposed on the protruding portion 332 and the member 90 or the member 90A disposed on the mounting surface 311M can be the same as that described in the first embodiment.

Fourth Embodiment

Figure 22:
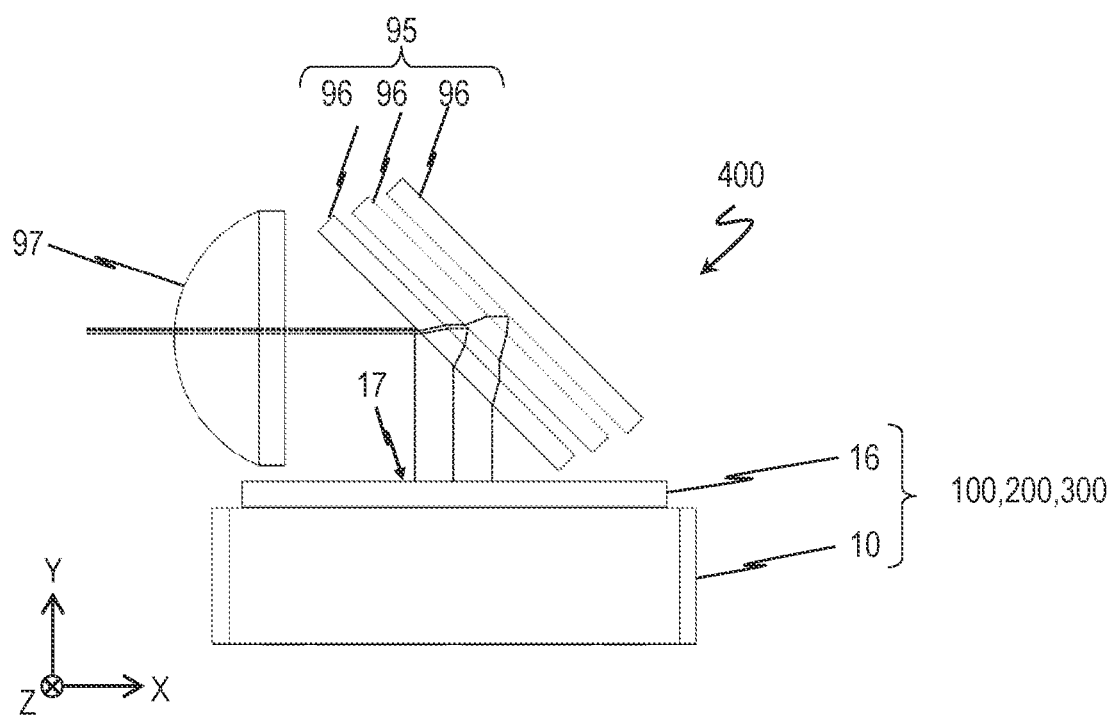
FIG. 22 is a schematic plane view of a light-emitting device according to a fourth embodiment, as viewed along the Z-axis from the negative direction.

With reference to FIG. 22, a light-emitting device 400 according to a fourth embodiment will be described. FIG. 22 is a schematic plane view of a light-emitting device 400 as viewed along the Z-axis in the negative direction.

The light-emitting device 400 according to the present embodiment includes a beam combiner 95 and a lens member 97 in addition to the one or more components of the light-emitting device 100, 200 or 300 according to the first embodiment or the second embodiment.

Beam Combiner 95

The beam combiner 95 is configured to coaxially align a plurality of light beams and emit a multiplexed light beam. The beam combiner 95 has a structure that is made up of a plurality optical members. The optical members 96 can be formed of a transparent material such as glass or plastic that allows visible light to pass through. For the optical members 96, dichroic mirrors can be employed. A dichroic mirror is formed with a dielectric multilayer film having predetermined wavelength selectivity. Such a dielectric multilayer films can be made of $Ta_2O_5/SiO_2$, $TiO_2/SiO_2$, $Nb_2O_5/SiO_2$, or the like.

Lens Member 97

The lens member 97 can have one or more lens surfaces. The lens member 97 is configured to collimate incident light. For example, one or more lens surfaces are designed to receive light emitted from the focal point position, and by refraction, convert the divergent light into collimated light, and then release the collimated light from the lens member 97. In the example shown in FIG. 22, the lens member 97 has a single lens surface. The lens member 97 can be formed of a transparent material such as glass or plastic.

In the example shown in FIG. 22, the beam combiner 95 coaxially aligns a plurality of light beams emitted from the light extraction surface 17, 317 of the package 10, 310 in the Y-axis direction, and emits multiplexed light having an optical axis in parallel to the X-direction. The lens member 97 receives divergent light emitted from the light-emitting points 23 of the light-emitting elements 20, and by refraction, converts the divergent light into collimated light and emits the collimated light.

As in the present embodiment, when a plurality of light beams of different wavelengths are made incident through a single lens surface to carry out optical control such as collimation, reduction of chromatic aberration and adjustment of optical path length of each light beam may be required. In the light-emitting device according to the present disclosure, it is possible, for example, to shift the light-emitting point of the light-emitting device that emits red light forward with respect to the light-emitting point of the light-emitting device that emits blue light. This makes it easier to adjust the optical path lengths of red light and blue light. Adjustment by shifting the light-emitting points can be performed without the need for new optical components, such that the light-emitting device according to the present disclosure can contribute to a reduction in the number of components.

Certain embodiments of the present invention have been described above, but the light-emitting devices according to the present invention are not strictly limited thereto. That is, the present invention can be achieved without being limited to the external shapes and the structures of the light-emitting devices disclosed in the embodiments. It is also not required that all of the components of the described embodiments be provided. For example, in the case in which part of components of the light-emitting device disclosed in the embodiment is not disclosed in the claims, design flexibility such as substitution, omission, deformation, and changes in materials of the part of components by a person skilled in the art are permitted, and application of the invention described in the claims is specified. In addition, the configurations provided by each embodiment may be referred to as collectively, if the technical features and functions are common. For example, an expression such as "member having an inclined surface" includes the member 90 according to the first embodiment and the member 90A according to the second embodiment. Also, a member described as "a member having a flat surface that is located higher than the mounting surface of the base portion" may also be referred to as a "mounting block portion". In this case, the term "mounting block portion" includes the lower submount 32 disposed on the base portion 11 according to the first embodiment and the protruding portion 332 disposed on the base portion 311 according to the third embodiment.

The light-emitting devices according to the embodiments are applicable in head-mounted displays, projectors, lighting, displays, etc.

What is claimed is:

1. A light-emitting device comprising:
    a first light-emitting element having a first emission end surface including one or more first light-emitting points each configured to emit a first light;
    a second light-emitting element having a second emission end surface including one or more second light-emitting points each configured to emit a second light;
    a plurality of upper submounts; and
    a lower submount,
    wherein
    the plurality of upper submounts include
        a first submount including a first upper surface on which the first light-emitting element is disposed, and a first lateral surface extending from the first upper surface and located on a same side as the first emission end surface of the first light-emitting element, and
        a second submount including a second upper surface on which the second light-emitting element is disposed, and a second lateral surface extending from the second upper surface and located on a same side as the second emission end surface of the second light-emitting element,
    the lower submount including an upper surface on which the first submount and the second submount are disposed, and a front lateral surface extending from the upper surface and located on a same side as the first lateral surface of the first submount and the second lateral surface of the second submount,
    in a top plan view of the upper surface of the lower submount, with a propagating direction of the first light along an optical axis being forward,
        the first lateral surface of the first submount is located more forward than the second lateral surface of the second submount,
        the first emission end surface of the first light-emitting element is located more forward than the second emission end surface of the second light-emitting element, and
        at least a portion of the first lateral surface of the first submount is protruded more forward than an edge along which the upper surface and the front lateral surface of the lower submount meet.

2. The light-emitting device according to claim 1, wherein a plane including the first lateral surface of the first submount is parallel to a plane including the second lateral surface of the second submount, while the first lateral surface of the first submount is not parallel to the edge.

3. The light-emitting device according to claim 1, wherein a plane including the first lateral surface of the first submount is parallel to a plane including the first emission end surface of the first light-emitting element.

4. The light-emitting device according to claim 1, wherein at least one of the one or more first light-emitting points of the first light-emitting element is located more forward than the edge, and at least one of the second light-emitting points of the second light-emitting element is located more backward than the edge.

5. The light-emitting device according to claim 1, wherein the first light emitted from the first light-emitting element has an angle of divergence in a fast-axis direction greater than an angle of divergence in a fast-axis direction of the second light emitted from the second light-emitting element.

6. The light-emitting device according to claim 1, wherein the upper surface of the lower submount has a parallelogram shape.

7. The light-emitting device according to claim 1, wherein the first emission end surface of the first light-emitting element includes two or more first light-emitting points including the one or more first light-emitting points, and
    the second emission end surface of the first light-emitting element includes two or more second light-emitting points including the one or more second light-emitting points.

8. The light-emitting device according to claim 7, wherein at least one of the two or more first light-emitting points of the first light-emitting element is located more forward than the edge in the top plan view.

9. The light-emitting device according to claim 1, further comprising
    a member having an inclined surface configured to be irradiated with at least a portion of the first light, wherein
    the member is disposed so that the inclined surface intersects the optical axis of the first light; and
    the first upper surface of the first submount overlaps partially with the inclined surface in the top plan view.

10. The light-emitting device according to claim 1, wherein
    the lower submount has a thickness greater than a thickness of the first submount and a thickness of the second submount as measured along a direction perpendicular to the upper surface of the lower submount.

11. The light-emitting device according to claim 9, further comprising
    a base portion including a mounting surface on which the member and the lower submount are disposed, wherein
    the inclined surface has light irradiation regions configured to receive the first light and the second light each having a far field pattern,
    a height from the mounting surface of the base portion to the upper surface of the lower submount is greater than a height from the mounting surface of the base portion to a lowermost edge of the light irradiation regions as measured along a direction perpendicular to the mounting surface of the base portion.

12. The light-emitting device according to claim 1, further comprising
    a third light-emitting element having a third emission end surface including one or more third light-emitting points each configured to emit a third light, wherein
    the plurality of upper submounts further include a third submount including a third upper surface on which the third light-emitting element is disposed, and a third lateral surface extending from the third upper surface and located on a same side as the third emission end surface of the third light-emitting element,
    the third lateral surface of the third submount is located on the same side as the first lateral surface of the first submount and the second lateral surface of the second submount, and in the top plan view,
the second lateral surface of the second submount is located more forward than the third lateral surface of the third submount, and
the second emission end surface of the second light-emitting element is located more forward than the third emission end surface of the third light-emitting element.

13. The light-emitting device according to claim 12, wherein
the first light-emitting element, the second light-emitting element, and the third light-emitting element are semiconductor laser elements, and
the first light is red light, the second light is green light, and the third light is blue light.

14. The light-emitting device according to claim 12, wherein
in a direction perpendicular to the optical axis of the first light and parallel to the first upper surface, the second submount has a width smaller than a width of the first submount and smaller than a width of the third submount.

15. The light-emitting device according to claim 12, wherein
in the propagating direction of the first light along the optical axis,
the first submount has a length greater than each of a length of the lower submount, a length of the second submount, and a length of the third submount, and
the length of the second submount is greater than the length of the third submount.

16. The light-emitting device according to claim 12, further comprising:
a first wiring region located on the first upper surface of the first submount on an opposite side of the second light-emitting element across the first light-emitting element, and one or more wires being electrically connected to the first wiring region;
a second wiring region located on the second upper surface of the second submount on an opposite side of the second emission end surface of the second light-emitting element, and one or more wires being electrically connected to the second wiring region; and
a third wiring region located on the third upper surface of the third submount on an opposite side of the second light-emitting element across the third light-emitting element, and one or more wires being electrically connected to the third wiring region.

17. The light-emitting device according to claim 12, wherein
a distance between adjacent ones of the first submount, the second submount and the third submount is in a range of 1 μm to 100 μm.

18. A light-emitting device comprising:
a first light-emitting element having a first emission end surface including one or more first light-emitting points each configured to emit a first light;
a second light-emitting element having a second emission end surface including one or more second light-emitting points each configured to emit a second light;
a first submount having a first upper surface, on which the first light-emitting element is disposed, and a first lateral surface extending from the first upper surface and located on a same side as the first emission end surface of the first light-emitting element;
a second submount having a second upper surface on which the second light-emitting element is disposed, and a second lateral surface extending from the second upper surface and located on a same side as the second emission end surface of the second light-emitting element; and
a package including a base portion having a mounting surface, lateral wall portions surrounding the mounting surface and extending upward, and a mounting block portion having an upper surface located higher than the mounting surface,
wherein the first submount and the second submount are disposed on the upper surface of the mounting block portion,
the mounting block portion further has a front lateral surface located on a same side as the first lateral surface and the second lateral surface, and extending from the upper surface of the mounting block portion, and
in a top plan view of the upper surface of the mounting block portion, with a propagating direction of the first light along an optical axis being forward,
the first lateral surface of the first submount is located more forward than the second lateral surface of the second submount,
the first emission end surface of the first light-emitting element is located more forward than the second emission end surface of the second light-emitting element, and
at least a portion of the first lateral surface of the first submount is protruded more forward than an edge along which the upper surface and the front lateral surface meet.

* * * * *